United States Patent
Kang et al.

(10) Patent No.: US 11,621,252 B2
(45) Date of Patent: Apr. 4, 2023

(54) DISPLAY DEVICE WHICH IS CAPABLE OF IMPLEMENTING AN LED IN A NON-TRANSFER MANNER AND METHOD OF MANUFACTURING THE SAME

(71) Applicant: LG Display Co., Ltd., Seoul (KR)

(72) Inventors: MinJae Kang, Seoul (KR); YongSeok Kwak, Paju-si (KR); KyuOh Kwon, Daejeon (KR); Junghun Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 414 days.

(21) Appl. No.: 16/591,526

(22) Filed: Oct. 2, 2019

(65) Prior Publication Data

US 2020/0161282 A1 May 21, 2020

(30) Foreign Application Priority Data

Nov. 15, 2018 (KR) .......................... 10-2018-0140534

(51) Int. Cl.
*H01L 25/075* (2006.01)
*H01L 25/065* (2023.01)
*H01L 25/16* (2023.01)

(52) U.S. Cl.
CPC ...... *H01L 25/0756* (2013.01); *H01L 25/0657* (2013.01); *H01L 25/167* (2013.01)

(58) Field of Classification Search
None
See application file for complete search history.

(56) References Cited

U.S. PATENT DOCUMENTS

| 2002/0079834 | A1 | 6/2002 | Dai et al. | |
|---|---|---|---|---|
| 2009/0161039 | A1* | 6/2009 | Toyama | G02F 1/133603 313/499 |
| 2017/0179192 | A1* | 6/2017 | Zhang | H01L 25/50 |

FOREIGN PATENT DOCUMENTS

| CN | 104282678 A | 1/2015 |
|---|---|---|
| CN | 106129028 A | 11/2016 |
| CN | 107342302 A | 11/2017 |
| KR | 10-2018-0078941 A | 7/2018 |

* cited by examiner

*Primary Examiner* — Daniel Whalen
(74) *Attorney, Agent, or Firm* — Seed IP Law Group LLP

(57) ABSTRACT

Provided is a display device. The display device includes a first substrate and a second substrate which are formed of different materials; a first LED disposed on the first substrate; and a second LED and a third LED disposed on the second substrate, in which the first LED, the second LED, and the third LED are disposed between the first substrate and the second substrate. Therefore, in consideration of the growth efficiency of the LEDs which emit different colored light, the first LED is disposed on the first substrate and the second LED and the third LED are disposed on the second substrate which is formed of a different material from the first substrate, thereby improving the growth efficiency of the plurality of LEDs.

10 Claims, 25 Drawing Sheets

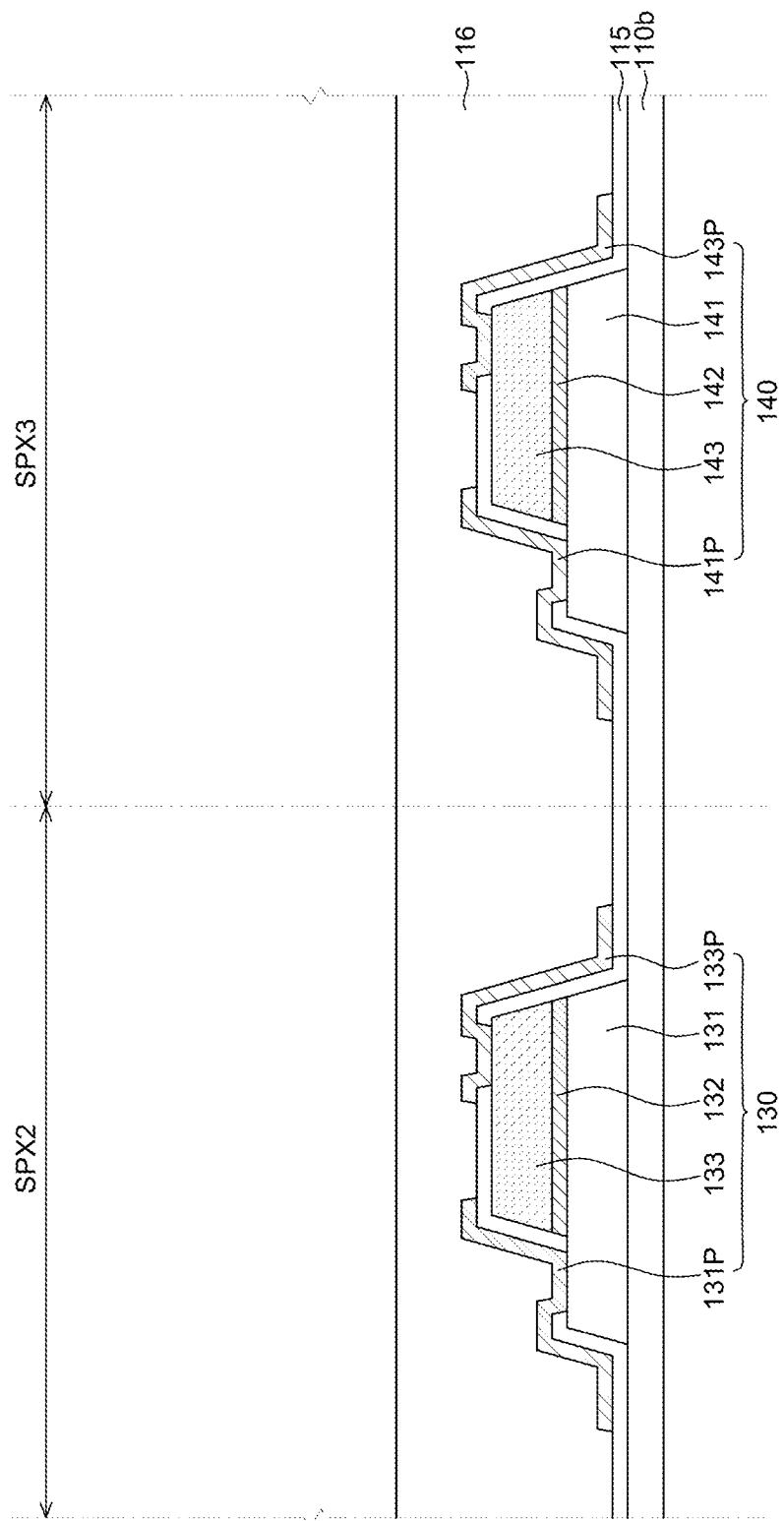

DISPLAY DEVICE WHICH IS CAPABLE OF IMPLEMENTING AN LED IN A NON-TRANSFER MANNER AND METHOD OF MANUFACTURING THE SAME

CROSS-REFERENCE TO RELATED APPLICATIONS

This application claims the priority of Korean Patent Application No. 10-2018-0140534 filed on Nov. 15, 2018, in the Korean Intellectual Property Office, the disclosure of which is incorporated herein by reference.

BACKGROUND

Technical Field

The present disclosure relates to a display device and a method of manufacturing the same, and more particularly to, a display device using a micro light emitting diode (LED) and a method of manufacturing the same.

Description of the Related Art

As display devices which are used for a monitor of a computer, a television, or a cellular phone, there are an organic light emitting display device (OLED) which is a self-emitting device and a liquid crystal display device (LCD) which typically has a separate light source.

An applicable range of the display device is diversified to personal digital assistants as well as monitors of computers and televisions and a display device with a large display area and a reduced volume and weight is being studied.

Further, in recent years, a display device including an LED is attracting attention as a next generation display device. Since the LED is formed of an inorganic material, rather than an organic material, reliability is excellent so that a lifespan thereof is longer than the liquid crystal display device or the organic light emitting display device. Further, the LED has a fast lighting speed, excellent luminous efficiency, and strong impact resistance so that stability is excellent and an image having high luminance can be displayed.

BRIEF SUMMARY

In order to manufacture an light emitting diode (LED), an epitaxial layer is grown on one wafer to form a plurality of LEDs. The LED which is completely manufactured in the wafer is transferred onto a backplane substrate to form a display device. However, when the display device including an LED is manufactured by individually transferring the plurality of LEDs, a process time is increased, and a manufacturing cost is also increased.

Therefore, in order to simplify the LED transferring process, inventors of the present disclosure invented a display device including a non-transfer type LED in which a driving unit including a thin film transistor and a capacitor is formed on a wafer on which the LED is grown.

However, growth efficiency of a red LED, a blue LED, and a green LED varies depending on the type of wafers so that it is difficult to concurrently grow the red LED, the blue LED, and the green LED on one wafer. Therefore, in order to implement a non-transfer type LED, the inventors of the present disclosure recognized that even though a plurality of driving units is formed on a wafer on which any one of the red LED, the blue LED, and the green LED is grown, it is difficult to grow LEDs which emit remaining color light on the wafer on which the plurality of driving units is formed. That is, the inventors of the present disclosure recognized that some LEDs can be implemented by a non-transfer type by forming a driving unit on the wafer, but the remaining LEDs should be transferred onto a wafer on which some LEDs are formed.

Therefore, the inventors of the present disclosure invented a display device which is capable of implementing all a red LED, a blue RED, and a green RED in a non-transfer manner and a method of manufacturing the same.

Various embodiments of the present disclosure provide a display device and a method of manufacturing the same in which a transferring process of a plurality of LEDs are simplified by using a wafer on which the plurality of LEDs is grown, as an upper substrate and a lower substrate of the display device.

Various embodiments of the present disclosure provide a display device and a method of manufacturing the same in which LEDs which emit different color light are grown on different substrates in consideration of growth efficiency to improve the efficiency of the LEDs.

Various embodiments of the present disclosure provide a display device and a method of manufacturing the same in which a plurality of LEDs and a plurality of driving units are formed on the same substrate to shorten a process time.

The various embodiments of the present disclosure are not limited to the above-mentioned embodiments, and other embodiments, which are not mentioned above, can be clearly understood by those skilled in the art from the following descriptions.

According to an embodiment of the present disclosure, a display device includes a first substrate and a second substrate that are formed of different materials, a first LED on the first substrate, and a second LED and a third LED on the second substrate, in which the first LED, the second LED, and the third LED are positioned between the first substrate and the second substrate. Therefore, in consideration of the growth efficiency of the LEDs which emit different colored light, the first LED is on the first substrate, and the second LED and the third LED are on the second substrate which is formed of a different material from the first substrate, thereby improving the growth efficiency of the plurality of LEDs.

According to another embodiment of the present disclosure, a display device includes a first substrate, a first light emitting diode (LED) on a surface of the first substrate, a second substrate, and a second LED and a third LED on a surface of the second substrate. The surface of the first substrate faces the surface of the second substrate. Growth efficiency of the first LED on the surface of the first substrate is higher than that on the second substrate, and growth efficiency of the second LED and the third LED on the surface of the second substrate is higher than that on the first substrate. Therefore, the first substrate on which the first LED is disposed and the second substrate on which the second LED and the third LED are disposed are disposed to be opposite to each other, thereby disposing the plurality of LEDs in a non-transfer manner.

According to still another embodiment of the present disclosure, a method of manufacturing a display device includes forming a first LED on one surface of a first substrate, forming a second LED and a third LED on one surface of a second substrate, and bonding the first substrate and the second substrate such that one surface of the first substrate and one surface of the second substrate are opposite to each other. Therefore, a wafer on which the plurality of LEDs is grown is used as an upper substrate and a lower substrate of the display device so that a transferring process of the LED is omitted, and the process time may be shortened.

Other detailed matters of the exemplary embodiments are included in the detailed description and the drawings.

According to the present disclosure, a plurality of LEDs is implemented in a display device in a non-transfer manner to shorten a process time as compared with a transferring manner.

According to the present disclosure, a plurality of LEDs is implemented in a display device in a non-transfer manner to reduce a non-adhering failure of the plurality of LEDs.

According to the present disclosure, a plurality of LEDs which is grown on different substrates in consideration of growth efficiency of the LED is disposed in a display device to improve luminous efficiency of the plurality of LEDs.

The effects according to the present disclosure are not limited to the contents exemplified above, and more various effects are included in the present specification.

BRIEF DESCRIPTION OF THE SEVERAL VIEWS OF THE DRAWINGS

The above and other embodiments, features and other advantages of the present disclosure will be more clearly understood from the following detailed description taken in conjunction with the accompanying drawings, in which.

DETAILED DESCRIPTION

Figure 1:
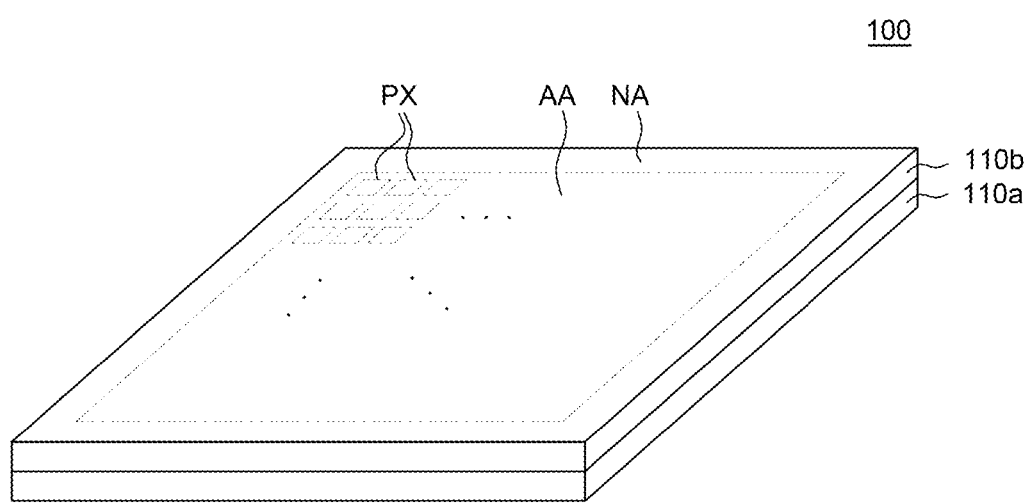
FIG. 1 is a schematic plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

FIG. 1 is a schematic plan view of a display device according to an exemplary embodiment of the present disclosure. In FIG. 1, for the convenience of description, among various components of a display device 100, only a first substrate 110a, a second substrate 110b, and a pixel PX are illustrated.

The first substrate 110a and the second substrate 110b are components for supporting various components included in the display device 100. For example, the first substrate 110a and the second substrate 110b may be formed of sapphire, gallium nitride, gallium arsenide, gallium phosphide, silicon, glass, or resin. Further, the first substrate 110a and the second substrate 110b may be formed to include polymer or plastic or may be formed of a plastic material having flexibility.

The first substrate 110a and the second substrate 110b include a display area AA and a non-display area NA.

The display area AA is an area where a plurality of pixels PX is disposed to display images. A display element and a driving circuit for driving the display element may be disposed in each of the plurality of pixels PX of the display area AA. For example, a display element and a semiconductor element for driving the display element may be disposed in each of the plurality of pixels PX.

The non-display area NA is an area where no image is displayed and various wiring lines and driver ICs for driving the plurality of pixels PX disposed in the display area AA are disposed. For example, in the non-display area NA, various ICs and driving circuits such as a gate driver IC and a data driver IC may be disposed.

The plurality of pixels PX is defined in the display area AA of the first substrate 110a and the second substrate 110b. The plurality of pixels PX is individual units which emit light and each of the plurality of pixels PX may include a plurality of sub pixels. One pixel may emit various color light by a combination of the plurality of sub pixels. For example, each of the plurality of pixels PX may be formed of a red sub pixel, a green sub pixel, and a blue sub pixel, but is not limited thereto.

Hereinafter, the light emitting diode (LED) and the driving unit disposed in each of the plurality of pixels PX will be described with reference to FIG. 2.

Figure 2:
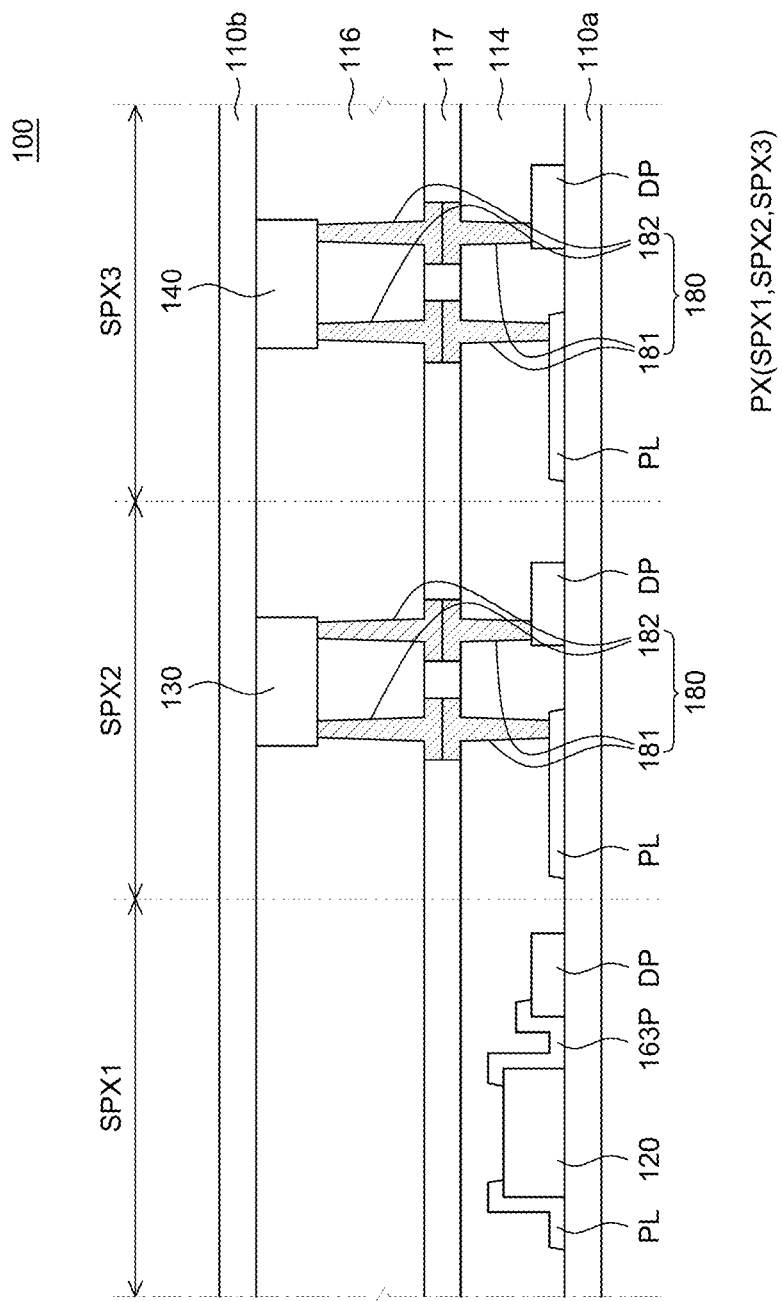
FIG. 2 is a schematic cross-sectional view of one pixel of a display device according to an exemplary embodiment of the present disclosure.

FIG. 2 is a schematic cross-sectional view of one pixel of a display device according to an exemplary embodiment of the present disclosure. In FIG. 2, for the convenience of description, only a first substrate 110a, a second substrate 110b, a plurality of LEDs 120, 130, and 140, a plurality of driving units DP, a second drain pad electrode 163P, a plurality of power lines PL, a first protective layer 114, a second protective layer 116, a filling member 117, and a connecting unit 180 are schematically illustrated.

Referring to FIG. 2, a plurality of LEDs 120, 130, and 140 is disposed on one surface of the first substrate 110a and one surface of the second substrate 110b. Each of the plurality of LEDs 120, 130, and 140 is disposed in each of the plurality of sub pixels SPX1, SPX2, and SPX3, respectively. The plurality of LEDs 120, 130, and 140 is a light emitting device which emits light at the time of applying a voltage. The plurality of LEDs 120, 130, and 140 may include LEDs which emit red light, green light, and blue light and implement various colored light including white by a combination of the LEDs.

The plurality of LEDs 120, 130, and 140 includes a first LED 120, a second LED 130, and a third LED 140.

The first LED 120 is disposed in a first sub pixel SPX1 on one surface of the first substrate 110a. The second LED 130 is disposed in a second sub pixel SPX2 on one surface of the second substrate 110b. The third LED 140 is disposed in a third sub pixel SPX3 on one surface of the second substrate 110b.

Hereinafter, for the convenience of description, an upper surface of the first substrate 110a on which the first LED 120 is disposed and which is opposite to the second LED 130 and the third LED 140 is assumed as one surface of the first substrate 110a. Further, a lower surface of the second substrate 110b on which the second LED 130 and the third LED 140 are disposed and which is opposite to the first LED 120 is assumed as one surface of the second substrate 110b.

In the meantime, when the plurality of LEDs 120 130, and 140 emits different colored light, some of the plurality of LEDs 120, 130, and 140 may be a red LED which emits red light and the other of the plurality of LEDs 120, 130, and 140 may be a green LED which emits green light, and the rest of the plurality of LEDs 120, 130, and 140 may be a blue LED which emits blue light. Since the plurality of LEDs 120, 130, and 140 emits different colored light, a member such as a color conversion layer may be omitted. Hereinafter, it is assumed that among the plurality of LEDs 120, 130, and 140, a first LED 120 is a red LED, a second LED 130 is a blue LED, and a third LED 140 is a green LED.

The plurality of driving units DP is disposed on the plurality of sub pixels SPX1, SPX2, and SPX3, respectively, on one surface of the first substrate 110a. The plurality of driving units DP is driving circuits for driving the plurality of LEDs 120, 130, and 140. The plurality of driving units DP includes a plurality of semiconductor elements and capacitors, which will be described below with reference to FIG. 3.

Among the plurality of driving units DP, a driving unit DP disposed in the first sub pixel SPX1 drives the first LED 120 of the first sub pixel SPX1 on one surface of the first substrate 110a. The driving unit DP disposed in the first sub pixel SPX1 is connected to the first LED 120 through the second drain pad electrode 163P. Among the plurality of driving units DP, a driving unit DP disposed in the second sub pixel SPX2 drives the second LED 130 of the second sub pixel SPX2 on one surface of the second substrate 110b. The driving unit DP disposed in the second sub pixel SPX2 is connected to the second LED 130 through the connecting unit 180. Among the plurality of driving units DP, a driving unit DP disposed in the third sub pixel SPX3 drives the third LED 140 of the third sub pixel SPX3 on one surface of the second substrate 110b. The driving unit DP disposed in the third sub pixel SPX3 is connected to the third LED 140 through the connecting unit 180.

The second drain pad electrode 163P is an electrode which is electrically connected to a second drain region of the second semiconductor element of the driving unit DP and electrically connects the second semiconductor element to the first LED 120. The second drain pad electrode 163P will be described below with reference to FIGS. 3 to 6.

The plurality of power lines PL is disposed on one surface of the first substrate 110a. The plurality of power lines PL transmits power voltages to the plurality of sub pixels SPX1, SPX2, and SPX3, respectively. The plurality of power lines PL may extend from the display area AA to the non-display area NA and receive the power voltage from the driver IC disposed in the non-display area NA to transmit the power voltage to the plurality of LEDs 120, 130, and 140.

The first protective layer 114 is disposed on one surface of the first substrate 110a so as to cover the first LED 120, the plurality of driving units DP, and the plurality of power lines PL of the first substrate 110a. The first protective layer 114 is a layer for protecting the first LED 120, the plurality of driving units DP, and the plurality of power lines PL on the first substrate 110a. The first protective layer 114 may be configured by a single layer or a double layer of translucent epoxy, silicon oxide SiOx or silicon nitride SiNx, but is not limited thereto. Further, even though in FIG. 2, it is illustrated that the upper surface of the first protective layer 114 is flat, the first protective layer 114 may be formed in accordance with the shapes of the first LED 120, the plurality of driving units DP, and the plurality of power lines PL, but is not limited thereto.

The second protective layer 116 is disposed on one surface of the second substrate 110*b* so as to cover the second LED 130 and the third LED 140 of the second substrate 110*b*. The second protective layer 116 is a layer for protecting the second LED 130 and the third LED 140 on one surface of the second substrate 110*b*. The second protective layer 116 may be configured by a single layer or a double layer of translucent epoxy, silicon oxide SiOx or silicon nitride SiNx, but is not limited thereto. Further, even though in FIG. 2, it is illustrated that a lower surface of the second protective layer 116 which is opposite to the upper surface of the first protective layer 114 is flat, the second protective layer 116 may be disposed in accordance with the shapes of the second LED 130 and the third LED 140, but is not limited thereto.

The filling member 117 is disposed between the first protective layer 114 and the second protective layer 116. The filling member 117 is disposed to fill the space between the upper surface of the first protective layer 114 and the lower surface of the second protective layer 116. That is, the filling member 117 may be disposed between one surface of the first substrate 110*a* and one surface of the second substrate 110*b* which are opposite to each other. The filling member 117 may minimize foreign matters from permeating between one surface of the first substrate 110*a* and one surface of the second substrate 110*b* and support the first substrate 110*a* and the second substrate 110*b* to maintain a strong bonded state.

In order to connect the plurality of driving units DP disposed on one surface of the first substrate 110*a* and the second LED 130 and the third LED 140 disposed on one surface of the second substrate 110*b*, a plurality of connecting units 180 is disposed. The plurality of connecting units 180 electrically connects the second LED 130 of the second substrate 110*b* to the driving unit DP and the power line PL disposed in the second sub pixel SPX2 of the first substrate 110*a*. The plurality of connecting units 180 electrically connects the third LED 140 of the second substrate 110*b* to the driving unit DP and the power line PL disposed in the third sub pixel SPX3 of the first substrate 110*a*. Therefore, the voltage may be supplied from the power line PL and the driving unit DP to the second LED 130 and the third LED 140 of one surface of the second substrate 110*b* through the plurality of connecting units 180 and light may be emitted from the second LED 130 and the third LED 140. The plurality of connecting units 180 will be described in more detail below with reference to FIGS. 4 and 6.

In the display device 100 according to one exemplary embodiment of the present disclosure, the first LED 120, the plurality of driving units DP, and the plurality of power lines PL are disposed on one surface of the first substrate 110*a* and the second LED 130 and the third LED 140 are disposed on one surface of the second substrate 110*b*. In this case, the first substrate 110*a* and the second substrate 110*b* may be disposed such that one surface of the first substrate 110*a* and one surface of the second substrate 110*b* are opposite to each other. Further, the plurality of driving units DP and the plurality of power lines PL of the first substrate 110*a* are electrically connected to the second LED 130 and the third LED 140 of the second substrate 110*b* through the plurality of connecting units 180 so that one display device 100 may be implemented.

Hereinafter, each of the plurality of sub pixels SPX1, SPX2, and SPX3 will be described in more detail with reference to FIGS. 3 to 6.

Figure 3:
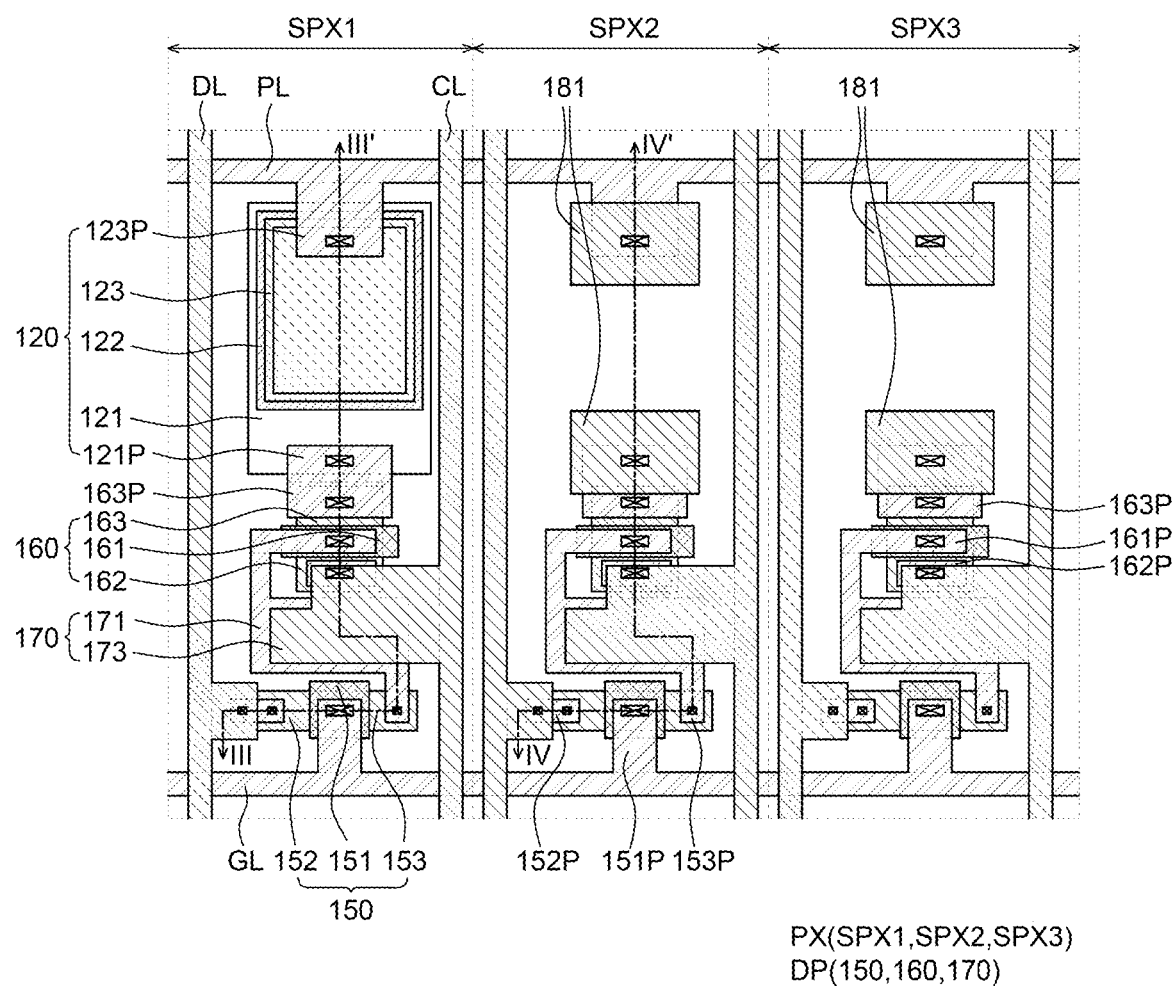
FIG. 3 is a plan view of one pixel on one surface of a first substrate of a display device according to an exemplary embodiment of the present disclosure.
Figure 4:
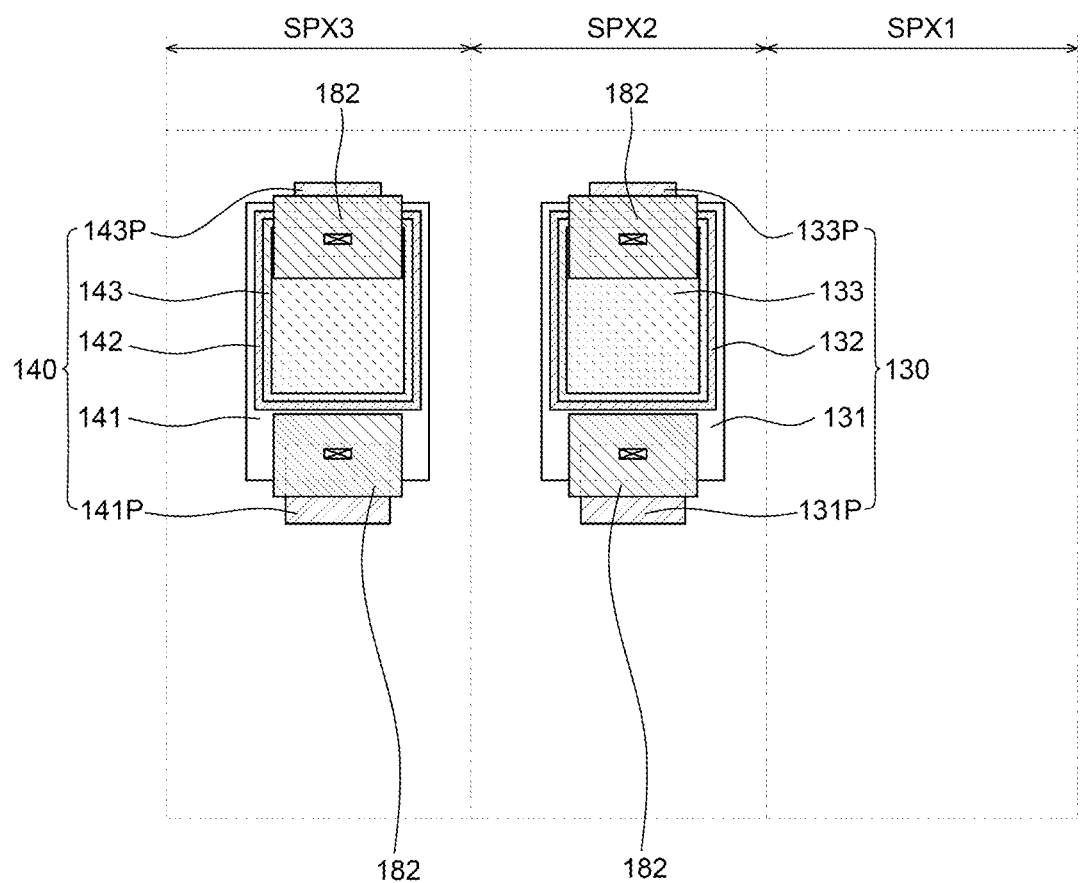
FIG. 4 is a plan view of one pixel on one surface of a second substrate of a display device according to an exemplary embodiment of the present disclosure.
Figure 5:
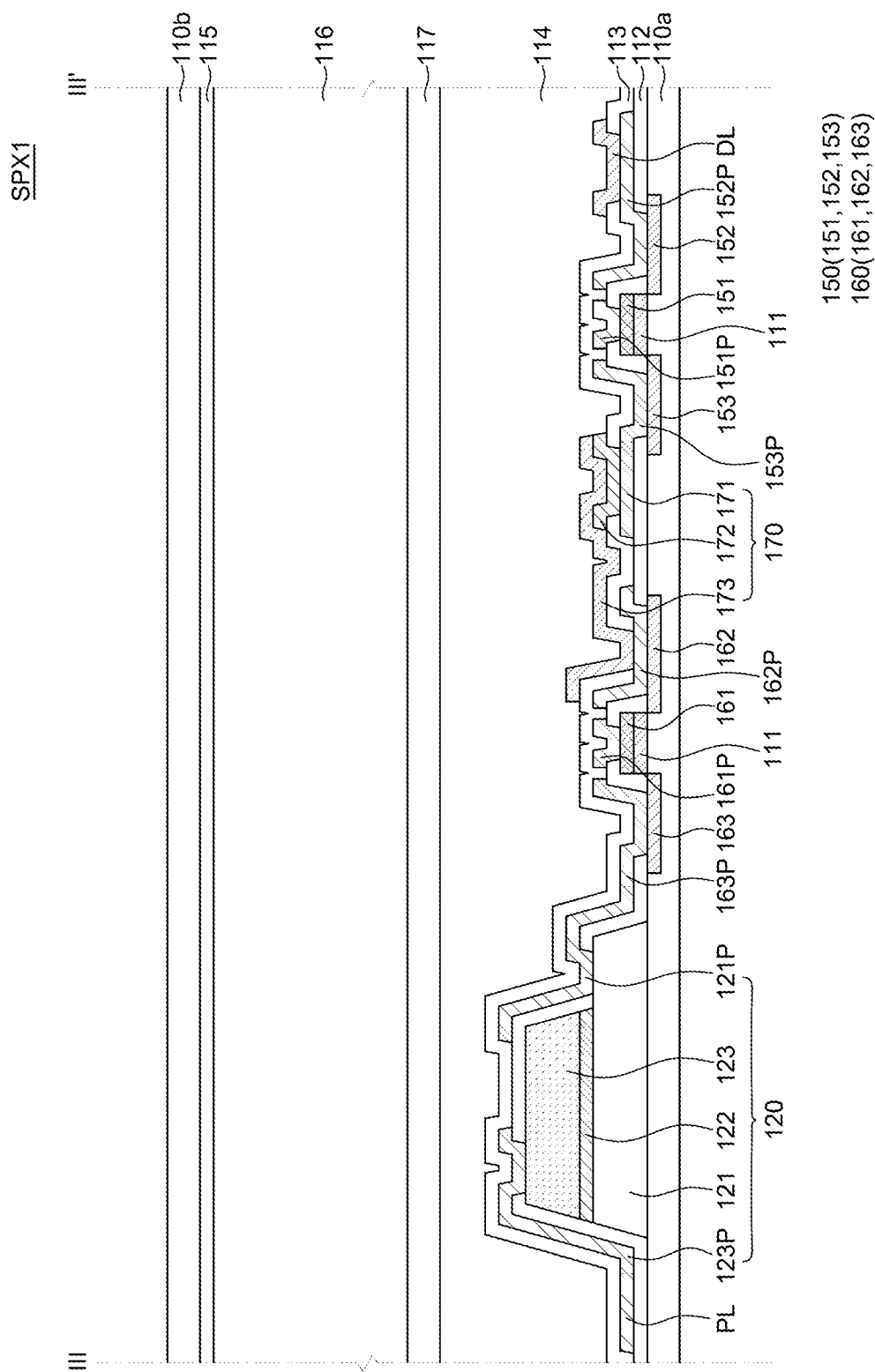
FIG. 5 is a cross-sectional view of a display device taken along the line III-III' of FIG. 3.
Figure 6:
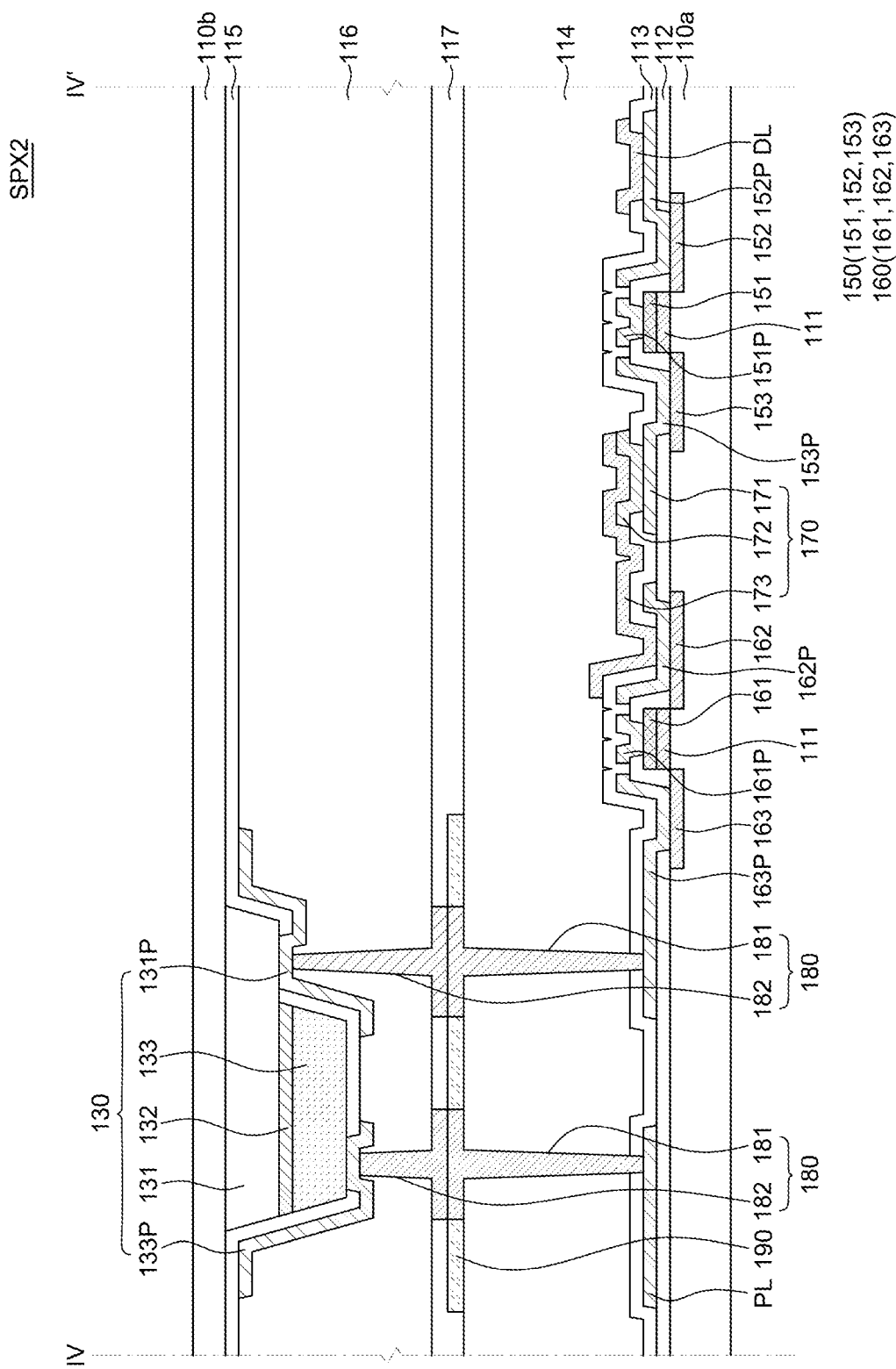
FIG. 6 is a cross-sectional view of a display device taken along the line IV-IV' of FIG. 3.

FIG. 3 is a plan view of one pixel on one surface of a first substrate of a display device according to an exemplary embodiment of the present disclosure. FIG. 4 is a plan view of one pixel on one surface of a second substrate of a display device according to an exemplary embodiment of the present disclosure. FIG. 5 is a cross-sectional view of a display device taken along the line of FIG. 3. FIG. 6 is a cross-sectional view of a display device taken along the line IV-IV' of FIG. 3. In the meantime, for the convenience of description, in FIG. 3, a reflective layer 190 is omitted.

Referring to FIGS. 3, 5, and 6, the first LED 120, the plurality of driving units DP, the plurality of wiring lines, and a first connecting unit 181 among the plurality of connecting units 180 are disposed on one surface of the first substrate 110*a*.

The first LED 120 is disposed in the first sub pixel SPX1. The first LED 120 includes a first n-type semiconductor layer 121, a first light emitting layer 122, a first p-type semiconductor layer 123, a first n-type electrode 121P, and a first p-type electrode 123P.

The first n-type semiconductor layer 121 is disposed on one surface of the first substrate 110*a* and the first p-type semiconductor layer 123 is disposed on the first n-type semiconductor layer 121. The first n-type semiconductor layer 121 and the first p-type semiconductor layer 123 may be formed by implanting n-type and p-type impurities into gallium nitride GaN. For example, the p-type impurity may be magnesium (Mg), zinc (Zn), and beryllium (Be), and the n-type impurity may be silicon (Si), germanium (Ge), and tin (Sn), but are not limited thereto.

The first light emitting layer 122 is disposed between the first n-type semiconductor layer 121 and the first p-type semiconductor layer 123. The first light emitting layer 122 is supplied with holes and electrons from the first n-type semiconductor layer 121 and the first p-type semiconductor layer 123 to emit light. For example, the first light emitting layer 122 is supplied with holes and electrons from the first n-type semiconductor layer 121 and the first p-type semiconductor layer 123 to emit red light. Hereinafter, it is assumed that the first LED 120 including the first light emitting layer 122 is a red LED.

The first light emitting layer 122 may be formed by a single layer or a multi-quantum well (MQW) structure, for example, the first light emitting layer 122 may be formed of indium gallium nitride (InGaN) or gallium nitride (GaN), but is not limited thereto.

A part of the first n-type semiconductor layer 121 outwardly protrudes from the first light emitting layer 122 and the first p-type semiconductor layer 123. The first light emitting layer 122 and the first p-type semiconductor layer 123 may have a smaller area than the first n-type semiconductor layer 121 so as to expose an upper surface of the first n-type semiconductor layer 121. The first n-type semiconductor layer 121 may be exposed from the first light emitting layer 122 and the first p-type semiconductor layer 123 so as to be electrically connected to the first n-type electrode 121P.

A first passivation layer 112 is disposed so as to cover the first n-type semiconductor layer 121, the first light emitting layer 122, and the first p-type semiconductor layer 123. The first passivation layer 112 is an insulating layer which protects components below the first passivation layer 112 and suppresses the electrical short circuit of the first n-type semiconductor layer 121 and the first p-type semiconductor layer 123. Specifically, the first n-type semiconductor layer 121 and the first p-type semiconductor layer 123 are electrically connected to different electrodes to supply electrons and holes to the first light emitting layer 122. When the electrode which is electrically connected to the first n-type semiconductor layer 121 or the first p-type semiconductor layer 123 is in contact with the first p-type semiconductor layer 123 or the first n-type semiconductor layer 121, the short circuit may be caused. Therefore, the first passivation layer 112 may be disposed as an insulating layer which insulates the first n-type semiconductor layer 121 from the first p-type semiconductor layer 123. For example, the first passivation layer 112 may be configured by a single layer or a double layer of silicon oxide SiOx or silicon nitride SiNx, but is not limited thereto.

In the meantime, the plurality of LEDs may be formed by various structures such as a lateral structure, a vertical structure, and a flip-chip structure. A lateral type LED includes a light emitting layer and an n-type electrode and a p-type electrode which are horizontally disposed on both sides of the light emitting layer. The lateral type LED emits light by coupling electrons supplied to the light emitting layer through the n-type electrode and holes supplied to the light emitting layer through the p-type electrode. A vertical type LED includes a light emitting layer and an n-type electrode and a p-type electrode which are disposed above and below the light emitting layer, respectively. Similarly to the lateral type LED, the vertical type LED also emits light by coupling the electrons and holes supplied from the n-type electrode and the p-type electrode. The flip-chip LED has substantially the same structure as the lateral type LED. However, the flip-chip LED 120 may be directly bonded to a printed circuit board by omitting a medium such as a metal wire. Hereinafter, for the convenience of description, among the plurality of LEDs 120, 130, and 140 of the display device 100 according to one exemplary embodiment of the present disclosure, it is assumed that the first LED 120 has a lateral structure, and the second LED 130 and the third LED 140 have a flip-chip structure. However, the present disclosure is not limited thereto.

The first n-type electrode 121P and the first p-type electrode 123P are disposed on the first passivation layer 112. The first n-type electrode 121P may be electrically connected to the first n-type semiconductor layer 121 and the first p-type electrode 123P may be electrically connected to the first p-type semiconductor layer 123. Specifically, a contact hole which exposes a part of the upper surface of the first n-type semiconductor layer 121 is disposed on the first passivation layer 112. The first n-type electrode 121P may be in contact with the upper surface of the first n-type semiconductor layer 121 through the contact hole. A contact hole which exposes a part of the upper surface of the first p-type semiconductor layer 123 is disposed on the first passivation layer 112. The first p-type electrode 123P may be in contact with the upper surface of the first p-type semiconductor layer 123 through the contact hole. Therefore, the first n-type electrode 121P and the first p-type electrode 123P may be in contact with the first n-type semiconductor layer 121 and the first p-type semiconductor layer 123 through the contact hole of the first passivation layer 112 to be electrically connected thereto.

The plurality of driving units DP is disposed in the plurality of sub pixels SPX1, SPX2, and SPX3, respectively. The plurality of wiring lines is disposed along boundaries between the plurality of sub pixels SPX1, SPX2, and SPX3. The plurality of driving units DP is disposed in the first sub pixels SPX1, the second sub pixels SPX2, and the third sub pixels SPX3, respectively and each of the plurality of driving units DP is configured by the first semiconductor element 150, a second semiconductor element 160, and a capacitor 170.

The plurality of wiring lines includes a plurality of gate lines GL, a plurality of data lines DL, a plurality of power lines PL, and a plurality of common lines CL and the plurality of lines is connected to the plurality of driving units DP, respectively, to drive the plurality of driving units DP.

First, a driving unit DP disposed in the first sub pixel SPX1 includes a first semiconductor element 150, a second semiconductor element 160, and a capacitor 170.

The first semiconductor element 150 and the second semiconductor element 160 are disposed in the first sub pixel SPX1 of one surface of the first substrate 110a. The first semiconductor element 150 and the second semiconductor element 160 may be used as driving elements of the display device 100. The first semiconductor element 150 and the second semiconductor element 160 may be a field effect transistor (FET) such as a thin film transistor (TFT), an N-channel metal oxide semiconductor (NMOS), a P-channel metal oxide semiconductor (PMOS), and a complementary metal oxide semiconductor (CMOS), but are not limited thereto. Hereinafter, it is assumed that the first semiconductor element 150 and the second semiconductor element 160 are N-channel metal oxide semiconductors among the field effect transistors, but are not limited thereto.

The first semiconductor element 150 includes a first gate electrode 151, a first source region 152, and a first drain region 153.

The first source region 152 and the first drain region 153 are spaced apart from each other to be disposed on one surface of the first substrate 110a. The first source region 152 and the first drain region 153 may be formed by doping n-type or p-type impurities on the first substrate 110a. In this case, the first substrate 110a may be a p-type or an n-type substrate. For example, when the first substrate 110a is a p-type substrate, the first source region 152 and the first drain region 153 may be formed by injecting the n-type impurities such as arsenic and phosphorus. Further, when the first substrate 110a is an n-type substrate, the first source region 152 and the first drain region 153 may be formed by injecting the p-type impurities such as boron. Hereinafter, it is assumed that the first substrate 110a is a p-type substrate and n-type impurities are injected into the first source region 152 and the first drain region 153, but the present disclosure is not limited thereto.

A gate insulating layer 111 is disposed between the first source region 152 and the first drain region 153. The gate insulating layer 111 is a layer for insulating the first source region 152 and the first drain region 153 from the first gate electrode 151. The gate insulating layer 111 is formed of an insulating material. For example, the gate insulating layer 111 may be configured by a single layer or a double layer of silicon oxide SiOx or silicon nitride SiNx, but is not limited thereto.

A first gate electrode 151 is disposed on the gate insulating layer 111. The first gate electrode 151 may be electrically connected to a gate line GL. When a gate voltage is applied from the gate line GL to the first gate electrode 151, the first semiconductor element 150 may be turned on. For example, the first gate electrode 151 may be formed of a conductive material such as poly silicon or molybdenum (Mo), but is not limited thereto.

In this case, the first passivation layer 112 is disposed on the first semiconductor element 150. The first passivation layer 112 may be disposed so as to cover the first gate electrode 151, the first source region 152, and the first drain region 153 of the first semiconductor element 150, together with the first n-type semiconductor layer 121, the first light emitting layer 122, and the first p-type semiconductor layer 123 of the first LED 120.

A first gate pad electrode 151P, a first source pad electrode 152P, and a first drain pad electrode 153P are disposed on the first passivation layer 112. The first gate pad electrode 151P, the first source pad electrode 152P, and the first drain pad electrode 153P may be electrically connected to the first gate electrode 151, the first source region 152, and the first drain region 153, respectively.

First, the first gate pad electrode 151P electrically connects the first gate electrode 151 and the gate line GL. The first gate pad electrode 151P is integrally formed with the gate line GL to be in contact with the first gate electrode 151.

Specifically, a contact hole which exposes the upper surface of the first gate electrode 151 may be disposed on the first passivation layer 112. Further, the first gate pad electrode 151P extending from the gate line GL to the first gate electrode 151 may be in contact with the upper surface of the first gate electrode 151 through the contact hole of the first passivation layer 112. Therefore, the gate line GL and the first gate electrode 151 may be electrically connected to each other by the first gate pad electrode 151P.

The first source pad electrode 152P electrically connects the first source region 152 and the data line DL to each other. Specifically, a contact hole which exposes the first source region 152 may be disposed on the first passivation layer 112. One end of the first source pad electrode 152P may be in contact with the first source region 152 through the contact hole of the first passivation layer 112. Further, the other end of the first source pad electrode 152P extends to the data line DL to be electrically connected to the data line DL. Accordingly, one end of the first source pad electrode 152P is in contact with the first source region 152 and the other end is in contact with the data line DL so that the first source region 152 of the first semiconductor element 150 may be electrically connected to the data line DL.

The first drain pad electrode 153P may be electrically connected to the first drain region 153. Specifically, a contact hole which exposes the first drain region 153 may be disposed on the first passivation layer 112. One end of the first drain pad electrode 153P may be in contact with the first drain region 153 through the contact hole of the first passivation layer 112. Accordingly, the first drain pad electrode 153P may be electrically connected to the first drain region 153 through the contact hole of the first passivation layer 112.

In this case, a first capacitor electrode 171 which extends from the first drain pad electrode 153P is disposed on the first passivation layer 112. The first capacitor electrode 171 is included in the capacitor 170 together with a dielectric layer 172 and a second capacitor electrode 173 which will be described below.

In the meantime, the first drain region 153 of the first semiconductor element 150 and the second gate electrode 161 of the second semiconductor element 160 are electrically connected to each other through the first drain pad electrode 153P, the first capacitor electrode 171, and a second gate pad electrode 161P to be described below. The first drain pad electrode 153P, the first capacitor electrode 171, and the second gate pad electrode 161P may be integrally formed with each other. As the second gate pad electrode 161P which is integrally formed with the first drain pad electrode 153P is in contact with the second gate electrode 161 of the second semiconductor element 160, the first drain region 153 of the first semiconductor element 150 may be electrically connected to the second gate electrode 161 of the second semiconductor element 160. Therefore, the first drain region 153 of the first semiconductor element 150 and the second gate electrode 161 of the second semiconductor element 160 are electrically connected to each other by the first drain pad electrode 153P, the first capacitor electrode 171, and the second gate pad electrode 161P which are integrally formed.

The second semiconductor element 160 includes a second gate electrode 161, a second source region 162, and a second drain region 163.

The second source region 162 and the second drain region 163 are spaced apart from each other to be disposed on one surface of the first substrate 110a. The second source region 162 and the second drain region 163 may be formed by doping n-type or p-type impurities on a p-type or an n-type substrate. As described above, it is assumed that the first substrate 110a is a p-type substrate and n-type impurities are injected into the second source region 162 and the second drain region 163, but the present disclosure is not limited thereto.

The gate insulating layer 111 is disposed between the second source region 162 and the second drain region 163, and the second gate electrode 161 is disposed on the gate insulating layer 111. For example, the second gate electrode 161 may be formed of a conductive material such as poly silicon and molybdenum (Mo), but is not limited thereto.

The second gate electrode 161 is electrically connected to the first drain region 153 of the first semiconductor element 150. Specifically, the second gate electrode 161 may be electrically connected to the first drain region 153 of the first semiconductor element 150 through the second gate pad electrode 161P, the first capacitor electrode 171, and the first drain pad electrode 153P. The first semiconductor element 150 transmits the voltage to the second semiconductor element 160 which is electrically connected thereto through the first drain region 153 to control the second semiconductor element 160 to be turned on or off.

The first passivation layer 112 is disposed on the second semiconductor element 160 and the second gate pad electrode 161P, the second source pad electrode 162P, and the second drain pad electrode 163P are disposed on the first passivation layer 112. The second gate pad electrode 161P, the second source pad electrode 162P, and the second drain pad electrode 163P may be electrically connected to the second gate electrode 161, the second source region 162, and the second drain region 163, respectively.

The second gate pad electrode 161P electrically connects the second gate electrode 161 to the first drain region 153 of the first semiconductor element 150. Specifically, a contact hole which exposes a part of an upper surface of the second gate electrode 161 may be disposed on the first passivation layer 112. The second gate pad electrode 161P may be in contact with the upper surface of the second gate electrode 161 through the contact hole of the first passivation layer 112. In this case, the second gate pad electrode 161P is integrally formed with the first drain pad electrode 153P and the first capacitor electrode 171. Therefore, the second gate electrode 161 may be electrically connected to the first drain region 153 of the first semiconductor element 150 through the second gate pad electrode 161P, the first capacitor electrode 171, and the first drain pad electrode 153P.

In the meantime, the second drain pad electrode 163P is electrically connected to the first LED 120. The second drain pad electrode 163P is integrally formed with the first n-type electrode 121P of the first LED 120 to electrically connect the second drain region 163 to the first n-type semiconductor layer 121. However, the second drain pad electrode 163P and the first n-type electrode 121P may not be integrally formed with each other, but may be individually disposed, and the present disclosure is not limited thereto.

The gate line GL and the power line PL are disposed on the first passivation layer 112. The gate line GL transmits the gate voltage to the driving units DP of the plurality of sub pixels SPX1, SPX2 and SPX3. Specifically, the gate line GL transmits the gate voltage to the first gate electrode 151 of the first semiconductor element 150 of each of the plurality of driving units DP. The gate line GL may extend from the display area AA to the non-display area NA. The gate line GL may be supplied with the gate voltage from the gate driver IC disposed in the non-display area NA to transmit the gate voltage to the first gate electrode 151 of the first semiconductor element 150 of each of the plurality of driving units DP.

The power line PL transmits the power voltage to the plurality of LEDs 120, 130, and 140 of the plurality of sub pixels SPX1, SPX2 and SPX3, respectively. Specifically, the power line PL transmits the power voltage to the p-type electrodes 123P, 133P, and 143P of the plurality of LEDs 120, 130, and 140. The power line PL may extend from the display area AA to the non-display area NA. The power line PL may be supplied with the power voltage from the driver IC disposed in the non-display area NA to transmit the power voltage to the plurality of LEDs 120, 130, and 140 of the plurality of sub pixels SPX1, SPX2, and SPX3.

In the meantime, the power line PL is electrically connected to the first LED 120. Specifically, the power line PL and the first p-type electrode 123P of the first LED 120 are integrally formed with each other to electrically connect the power line PL to the first p-type semiconductor layer 123. However, the power line PL and the first p-type electrode 123P may not be integrally formed with each other, but may be individually formed and the present disclosure is not limited thereto.

A second passivation layer 113 is disposed on the gate line GL, the power line PL, the first gate pad electrode 151P, the first source pad electrode 152P, the first drain pad electrode 153P, the second gate pad electrode 161P, the second source pad electrode 162P, the second drain pad electrode 163P, and the first capacitor electrode 171. The second passivation layer 113 is a layer for protecting and insulating components below the second passivation layer 113 and may be formed of an insulating material. For example, the second passivation layer 113 may be configured by a single layer or a double layer of silicon oxide SiOx or silicon nitride SiNx, but is not limited thereto.

The data line DL and the common line CL are disposed on the second passivation layer 113.

The data line DL transmits a data voltage to the driving units DP of the plurality of sub pixels SPX1, SPX2 and SPX3, respectively. Specifically, the data line DL transmits the data voltage to the first source region 152 of the first semiconductor element 150 of each of the plurality of driving units DP. The data line DL may extend from the display area AA to the non-display area NA. The data line DL may be supplied with the data voltage from the data driver IC disposed in the non-display area NA to transmit the data voltage to the first source region 152 of the first semiconductor element 150 of each of the plurality of driving units DP.

The common line CL transmits a common voltage to the driving units DP of the plurality of sub pixels SPX1, SPX2 and SPX3, respectively. Specifically, the common line CL may extend from the display area AA to the non-display area NA. The common line CL may transmit the common voltage from the gate driver IC disposed in the non-display area NA to the second capacitor electrode 173 and the second source region 162 of the second semiconductor element 160 of each of the plurality of driving units DP.

The second capacitor electrode 173 is disposed on the second passivation layer 113 so as to overlap the first capacitor electrode 171. The dielectric layer 172 is disposed between the first capacitor electrode 171 and the second capacitor electrode 173. Specifically, the first capacitor electrode 171 and the second capacitor electrode 173 overlap each other with the dielectric layer 172 therebetween to form the capacitor 170. The capacitor 170 stores the data voltage to maintain the plurality of LEDs 120, 130, and 140 in the same state until a next gate voltage is applied to the gate line GL.

A contact hole which exposes the first capacitor electrode 171 may be disposed on the second passivation layer 113. Further, the dielectric layer 172 may be disposed to fill the contact hole of the second passivation layer 113. The dielectric layer 172 may insulate the first capacitor electrode 171 from the second capacitor electrode 173. The dielectric layer 172 may improve a capacitance of the capacitor 170. Specifically, the permittivity of the dielectric layer 172 may be in proportional to the charging capacity of the capacitor 170 so that the dielectric layer 172 is formed of a high-K material having a large dielectric constant to improve the capacitance of the capacitor 170. However, the dielectric layer 172 may be omitted and instead of the dielectric layer 172, the second passivation layer 113 may serve as a dielectric layer 172 which insulates the first capacitor electrode 171 from the second capacitor electrode 173 and forms the capacitor 170.

The second capacitor electrode 173 is disposed on the dielectric layer 172 so as to overlap the first capacitor electrode 171. The second capacitor electrode 173 may be electrically connected to the common line CL. For example, the second capacitor electrode 173 may extend from the common line CL to the first capacitor electrode 171. The second capacitor electrode 173 and the common line CL may be integrally formed.

In this case, the second capacitor electrode 173 extends to the second source region 162 of the second semiconductor element 160 to be electrically connected to the second source region 162. Specifically, the second capacitor electrode 173 extends to the second source region 162 to be in contact with the second source pad electrode 162P which is electrically connected to the second source region 162. Therefore, the second capacitor electrode 173 which is integrally formed with the common line CL may be electrically connected to the second source region 162 of the second semiconductor element 160 through the second source pad electrode 162P.

The first protective layer 114 is disposed on the second capacitor electrode 173, the common line CL, and the data line DL. As described above, the first protective layer 114 is a layer for protecting the plurality of first LEDs 120, the plurality of driving units DP, and the plurality of wiring lines of one surface of the first substrate 110a. Further, the filling member 117, the second protective layer 116, and the second substrate 110b are disposed on the first protective layer 114.

In the meantime, even though in FIGS. 3 and 5, it is illustrated that each of the plurality of driving units DP includes the first semiconductor element 150, the second semiconductor element 160, and the capacitor 170, the number of the semiconductor elements and the capacitors of each of the plurality of driving units DP and the arrangement thereof are not limited thereto.

In the meantime, referring to FIG. 3, in the second sub pixel SPX2 and the third sub pixel SPX3, the plurality of connecting units 180 is disposed. The plurality of connecting units 180 is a configuration for electrically connecting the plurality of driving units DP and the plurality of wiring lines of one surface of the first substrate 110a to the second LED 130 and the third LED 140 of one surface of the second substrate 110b, which will be described in more detail with reference to FIGS. 4 and 6.

Referring to FIGS. 4 and 6, the second LED 130, the third LED 140, and a second connecting unit 182 of the plurality of connecting units 180 are disposed on one surface of the second substrate 110b.

First, the second LED 130 is disposed in the second sub pixel SPX2 on one surface of the second substrate 110b. The second LED 130 includes a second n-type semiconductor layer 131, a second light emitting layer 132, a second p-type semiconductor layer 133, a second n-type electrode 131P, and a second p-type electrode 133P.

The second n-type semiconductor layer 131 is disposed on one surface of the second substrate 110b and the second p-type semiconductor layer 133 is disposed on the second n-type semiconductor layer 131. The second n-type semiconductor layer 131 and the second p-type semiconductor layer 133 may be formed by injecting n-type and p-type impurities into gallium nitride.

Further, the second light emitting layer 132 is disposed between the second n-type semiconductor layer 131 and the second p-type semiconductor layer 133. The second light emitting layer 132 is supplied with holes and electrons from the second n-type semiconductor layer 131 and the second p-type semiconductor layer 133 to emit light. For example, the second light emitting layer 132 is supplied with holes and electrons from the second n-type semiconductor layer 131 and the second p-type semiconductor layer 133 to emit blue or green light.

A third passivation layer 115 is disposed so as to cover the second n-type semiconductor layer 131, the second light emitting layer 132, and the second p-type semiconductor layer 133. The third passivation layer 115 is an insulating layer which protects components below the third passivation layer 115 and suppresses the electrical short circuit of the second n-type semiconductor layer 131 and the second p-type semiconductor layer 133. For example, the third passivation layer 115 may be configured by a single layer or a double layer of silicon oxide SiOx or silicon nitride SiNx, but is not limited thereto.

The second n-type electrode 131P and the second p-type electrode 133P are disposed on the third passivation layer 115. The second n-type electrode 131P may be electrically connected to the second n-type semiconductor layer 131 and the second p-type electrode 133P may be electrically connected to the second p-type semiconductor layer 133. Specifically, a contact hole which exposes a part of the upper surface of the second n-type semiconductor layer 131 is disposed on the third passivation layer 115. The second n-type electrode 131P may be in contact with the upper surface of the second n-type semiconductor layer 131 through the contact hole. A contact hole which exposes a part of the upper surface of the second p-type semiconductor layer 133 is disposed on the third passivation layer 115. The second p-type electrode 133P may be in contact with the upper surface of the second p-type semiconductor layer 133 through the contact hole. Therefore, the second n-type electrode 131P and the second p-type electrode 133P may be in contact with the second n-type semiconductor layer 131 and the second p-type semiconductor layer 133 through the contact hole of the third passivation layer 115 to be electrically connected thereto.

The third LED 140 is disposed in the third sub pixel SPX3 on one surface of the second substrate 110b. The third LED 140 includes a third n-type semiconductor layer 141, a third light emitting layer 142, a third p-type semiconductor layer 143, a third n-type electrode 141P, and a third p-type electrode 143P.

The third n-type semiconductor layer 141 is disposed on one surface of the second substrate 110b and the third p-type semiconductor layer 143 is disposed on the third n-type semiconductor layer 141. The third n-type semiconductor layer 141 and the third p-type semiconductor layer 143 may be formed by injecting n-type and p-type impurities into gallium nitride.

Further, the third light emitting layer 142 is disposed between the third n-type semiconductor layer 141 and the third p-type semiconductor layer 143. The third light emitting layer 142 is supplied with holes and electrons from the third n-type semiconductor layer 141 and the third p-type semiconductor layer 143 to emit light. For example, the third light emitting layer 142 is supplied with holes and electrons from the third n-type semiconductor layer 141 and the third p-type semiconductor layer 143 to emit green or blue light.

Hereinafter, it is assumed that the second LED 130 including the second light emitting layer 132 is a blue LED and the third LED 140 including the third light emitting layer 142 is a green LED, but the second LED 130 may be a green LED and the third LED 140 may be a blue LED. However, the present disclosure is not limited thereto.

The third passivation layer 115 is disposed so as to cover the third n-type semiconductor layer 141, the third light emitting layer 142, and the third p-type semiconductor layer 143. The third n-type electrode 141P and the third p-type electrode 143P are disposed on the third passivation layer 115. The third n-type electrode 141P may be electrically connected to the third n-type semiconductor layer 141 and the third p-type electrode 143P may be electrically connected to the third p-type semiconductor layer 143. Specifically, a contact hole which exposes a part of the upper surface of the third n-type semiconductor layer 141 is disposed on the third passivation layer 115. The third n-type electrode 141P may be in contact with the upper surface of the third n-type semiconductor layer 141 through the contact hole. A contact hole which exposes a part of the upper surface of the third p-type semiconductor layer 143 is disposed on the third passivation layer 115. The third p-type electrode 143P may be in contact with the upper surface of the third p-type semiconductor layer 143 through the contact hole. Therefore, the third n-type electrode 141P and the third p-type electrode 143P may be in contact with the third n-type semiconductor layer 141 and the third p-type semiconductor layer 143 through the contact hole of the third passivation layer 115 to be electrically connected thereto.

The second protective layer 116 is disposed on one surface of the second substrate 110b so as to cover a plurality of second LEDs 130 and a plurality of third LEDs 140. As described above, the second protective layer 116 is a layer for protecting the plurality of second LEDs 130 and the plurality of third LEDs 140 on one surface of the second substrate 110b.

The plurality of connecting units 180 is disposed on the first protective layer 114 and the second protective layer 116. The plurality of connecting units 180 includes a first connecting unit 181 and a second connecting unit 182. The first connecting unit 181 is disposed on the first protective layer 114 to be connected to the plurality of driving units DP and the plurality of wiring lines of the first substrate 110a. The second connecting unit 182 is disposed on the second protective layer 116 to be connected to the second LED 130 and the third LED 140 of the second substrate 110*b*.

Referring to FIG. 6, the first connecting unit 181 is electrically connected to the plurality of driving units DP and the plurality of wiring lines of one surface of the first substrate 110*a*. Specifically, the contact hole which exposes the plurality of power lines PL, the second drain pad electrode 163P of the driving unit DP disposed in the second sub pixel SPX2, and the second drain pad electrode 163P of the driving unit DP disposed in the third sub pixel SPX3 may be disposed on the first protective layer 114 of one surface of the first substrate 110*a*. The first connecting unit 181 may be in contact with the plurality of power lines PL and the top surfaces of the second drain pad electrodes 163P of the second sub pixel SPX2 and the third sub pixel SPX3 through the contact hole. Therefore, the first connecting unit 181 disposed on the top surface of the first protective layer 114 may be electrically connected to the plurality of power lines PL and the second drain pad electrodes 163P of the second sub pixel SPX2 and the third sub pixel SPX3 through the contact hole of the first protective layer 114.

Referring to FIGS. 4 and 6, the second connecting unit 182 is electrically connected to the second LED 130 and the third LED 140 of one surface of the second substrate 110*b*. Specifically, the contact hole which exposes the second n-type electrode 131P and the second p-type electrode 133P of the second LED 130 may be disposed on the second protective layer 116 which covers the second LED 130 of one surface of the second substrate 110*b*. The contact hole which exposes the third n-type electrode 141P and the third p-type electrode 143P of the third LED 140 may be disposed on the second protective layer 116 which covers the third LED 140 of one surface of the second substrate 110*b*. The second connecting unit 182 may be in contact with the upper surfaces of the second n-type electrode 131P and the second p-type electrode 133P of the second LED 130 and the third n-type electrode 141P and the third p-type electrode 143P of the third LED 140. Therefore, the second connecting unit 182 disposed on the upper surface of the second protective layer 116 may be electrically connected to the second LED 130 and the third LED 140 through the contact hole of the second protective layer 116.

Referring to FIG. 6, the first connecting unit 181 of the first substrate 110*a* and the second connecting unit 182 of the second substrate 110*b* may be electrically connected to each other. Specifically, one surface of the first substrate 110*a* and one surface of the second substrate 110*b* are disposed to be opposite to each other. The first connecting unit 181 disposed on one surface of the first substrate 110*a* and the second connecting unit 182 disposed on one surface of the second substrate 110*b* may be in contact with each other. In this case, the first connecting unit 181 and the second connecting unit 182 may be bonded to each other by means of a conductive ball or a Eutectic bonding method to be fixed.

For example, when the conductive ball is used, the conductive ball is not disposed between the first protective layer 114 and the second protective layer 116, but the conductive ball is disposed only between the first connecting unit 181 and the second connecting unit 182 to electrically connect the first connecting unit 181 and the second connecting unit 182 to each other. In this case, when the conductive ball is disposed in an area between the first protective layer 114 and the second protective layer 116 which does not overlap the first connecting unit 181 and the second connecting unit 182, the light emission from the first LED 120 of the first substrate 110*a* may be interrupted. Therefore, the conductive ball may be selectively disposed only between the first connecting unit 181 and the second connecting unit 182.

For example, when the Eutectic bonding method is used, the first connecting unit 181 and the second connecting unit 182 are subjected to the hot pressure welding process at a high temperature without applying a separate adhesive material to bond the first connecting unit 181 and the second connecting unit 182 to each other. In this case, the first connecting unit 181 and the second connecting unit 182 may be formed of Eutectic metal for the Eutectic bonding and for example, may be formed of tin (Sn), indium (In), Zinc (Zn), lead (Pb), nickel (Ni), gold (Au), platinum (Pt), and copper (Cu), but is not limited thereto.

A first connecting unit 181 which is connected to the power line PL among the first connecting units 181 may be in contact with a second connecting unit 182 which is connected to the second p-type electrode 133P of the second LED 130 and the third p-type electrode 143P of the third electrode 140 among the second connecting units 182. Therefore, the power line PL may be electrically connected to the second p-type electrode 133P and the second p-type semiconductor layer 133 of the second LED 130 through the first connecting unit 181 and the second connecting unit 182. The power line PL may be electrically connected to the third p-type electrode 143P and the third p-type semiconductor layer 143 of the third LED 140 through the first connecting unit 181 and the second connecting unit 182.

A first connecting unit 181 which is connected to the second drain pad electrodes 163P of the second sub pixel SPX2 and the third sub pixel SPX3 among the first connecting units 181 may be in contact with a second connecting unit 182 which is connected to the second n-type electrode 131P and the third n-type electrode 141P of the second sub pixels SPX2 and the third sub pixels SPX3 among the second connecting units 182. Therefore, the second semiconductor element 160 of the second sub pixel SPX2 may be electrically connected to the second n-type electrode 131P and the second n-type semiconductor layer 131 of the second LED 130 through the first connecting unit 181 and the second connecting unit 182. The second semiconductor element 160 of the third sub pixel SPX3 may be electrically connected to the third n-type electrode 141P and the third n-type semiconductor layer 141 of the third LED 140 through the first connecting unit 181 and the second connecting unit 182. Therefore, the second LED 130 and the third LED 140 of the second substrate 110*b* may be electrically connected to the power line PL of the first substrate 110*a* and the second semiconductor element 160 of the plurality of driving units DP to emit light.

The reflective layer 190 is disposed between the first protective layer 114 and the second protective layer 116. Specifically, the reflective layer 190 may be disposed so as to overlap only the sub pixels SPX2, and SPX3 in which the LEDs 130, and 140 are disposed on one surface of the second substrate 110*b*, among the plurality of sub pixels SPX1, SPX2, and SPX3. For example, when the second LED 130 and the third LED 140 are disposed in the second sub pixel SPX2 and the third sub pixel SPX3 of one surface of the second substrate 110*b*, respectively, the reflective layer 190 may be disposed so as to overlap only the second sub pixels SPX2 and the third sub pixel SPX3. The reflective layer 190 disposed in the second sub pixels SPX2 and the third sub pixel SPX3 may overlap the second LED 130 and the third LED 140 of the second substrate 110*b*.

In contrast, when the reflective layer 190 is disposed so as to overlap only the first sub pixel SPX1 in which the first LED 120 is disposed on one surface of the first substrate 110*a* among the plurality of sub pixels SPX1, SPX2, and SPX3, the reflective layer 190 may interrupt the light emitted from the first LED 120 of one surface of the first substrate 110*a* from being discharged through the second substrate 110*b*. Therefore, the reflective layer 190 may be disposed so as not to overlap the first LED 120 disposed on one surface of the first substrate 110*a*, but to overlap only the second LED 130 and the third LED 140 disposed on one surface of the second substrate 110*b*.

In the meantime, the light emitted from the plurality of LEDs 120, 130, and 140 may be discharged through the second substrate 110*b*. Therefore, the second substrate 110*b* may be formed of a transparent substrate. Further, the reflective layer 190 which is disposed on the first protective layer 114 so as to overlap the second LED 130 and the third LED 140 reflects light which is directed to the first substrate 110*a* among light emitted from the second LED 130 and the third LED 140 toward the second substrate 110*b*, thereby increasing the optical efficiency. Therefore, the reflective layer 190 is disposed on the first protective layer 114 to reflect again the light emitted below the second LED 130 and the third LED 140 on the first protective layer 114 to one surface of the second substrate 110*b*, that is, an opposite surface of one surface of the second substrate 110*b*, thereby improving the optical efficiency. The reflective layer 190 may be formed of a non-conductive material having a high reflectance, and for example, the reflective layer 190 may be a distributed Bragg reflector or titanium oxide TiO2, but is not limited thereto.

In the meantime, even though not illustrated in the drawing, a black matrix may be further disposed along boundaries of the first sub pixels SPX1, the second sub pixel SPX2, and the third sub pixels SPX3, on the second substrate 110*b*. For example, in the second protective layer 116 of the second substrate 110*b*, the black matrix is further disposed at the boundaries of the first sub pixels SPX1, the second sub pixel SPX2, and the third sub pixels SPX3, on the second substrate 110*b* to reduce the color mixture of the light emitted from the plurality of LEDs 120, 130, and 140.

The display device 100 according to one exemplary embodiment of the present disclosure may implement the display device 100 by bonding the first substrate 110*a* on which the plurality of first LEDs 120 is grown and the second substrate 110*b* on which the plurality of second LEDs 130 and the plurality of third LEDs 140 are grown. The first LED 120 is disposed on one surface of the first substrate 110*a* and the second LED 130 and the third LED 140 are disposed on one surface of the second substrate 110*b*. Further, the plurality of driving units DP which drives the first LED 120, the second LED 130, and the third LED 140 is disposed on one surface of the first substrate 110*a*. The plurality of second LEDs 130 and the plurality of third LEDs 140 are disposed on one surface of the second substrate 110*b*. Further, one surface of the first substrate 110*a* is disposed so as to be opposite to one surface of the second substrate 110*b* to electrically connect some driving units DP of the plurality of driving units DP and some power lines PL among the plurality of power lines PL of one surface of the first substrate 110*a* to the second LED 130 and the third LED 140 of one surface of the second substrate 110*b*. Therefore, the plurality of LEDs 120, 130, and 140 disposed on different substrates is electrically connected to the plurality of driving units DP and the plurality of wiring lines to implement one display device 100. Therefore, the plurality of LEDs 120, 130, and 140 disposed on different substrates is not transferred onto different substrates, but the first substrate 110*a* and the second substrate 110*b* are disposed so as to be opposite to each other so that the plurality of LEDs 120, 130, and 140 may be connected to the plurality of driving units DP and the plurality of wiring lines in a non-transfer manner.

Hereinafter, a display device 100 and a manufacturing method of a display device 100 according to an exemplary embodiment of the present disclosure will be described in detail with reference to FIGS. 7A to 7O.

Figure 7A:
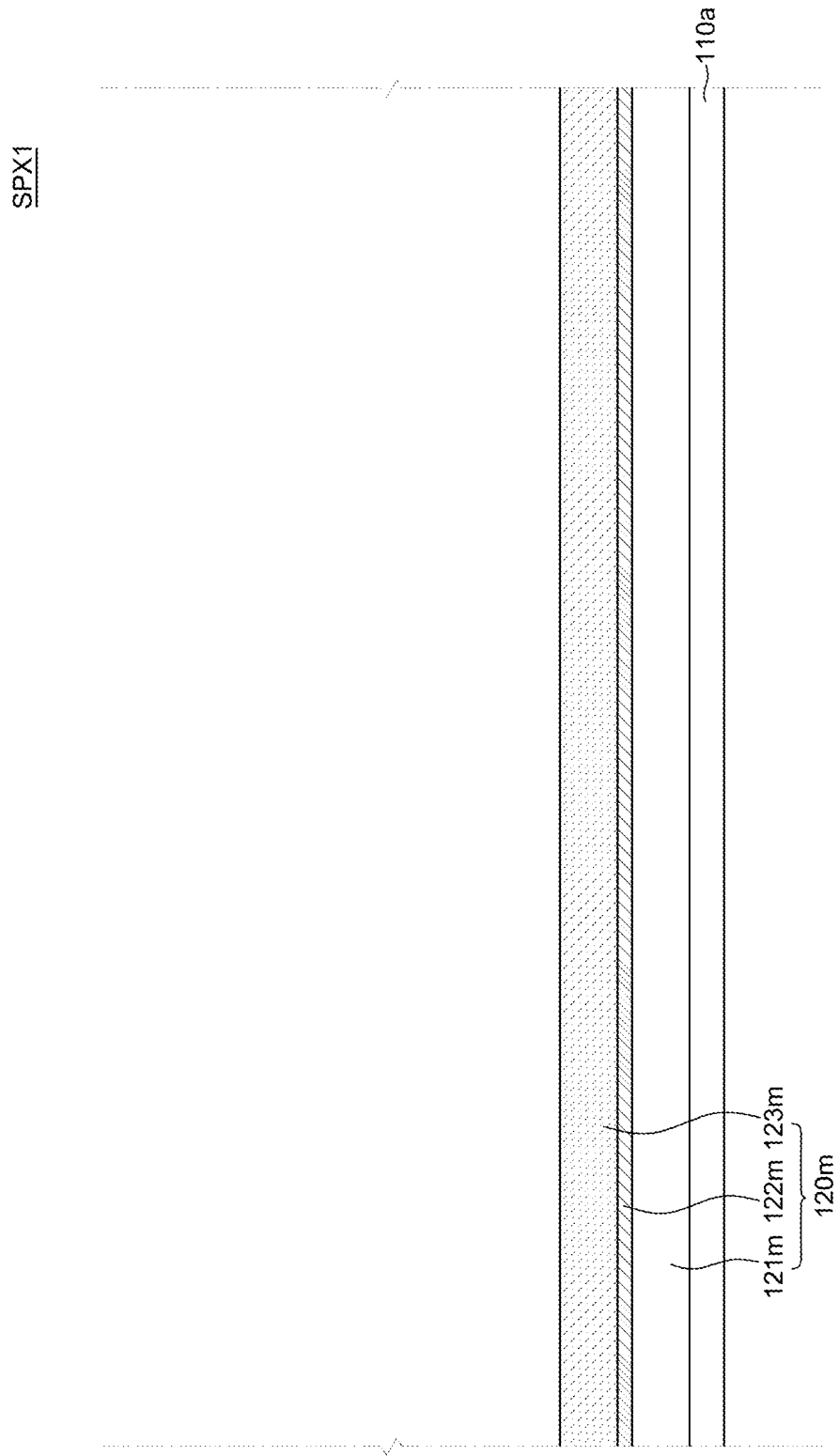
FIGS. 7A to 7O are schematic views of processes for explaining a display device and a manufacturing method of the display device according to an exemplary embodiment of the present disclosure.
Figure 7B:
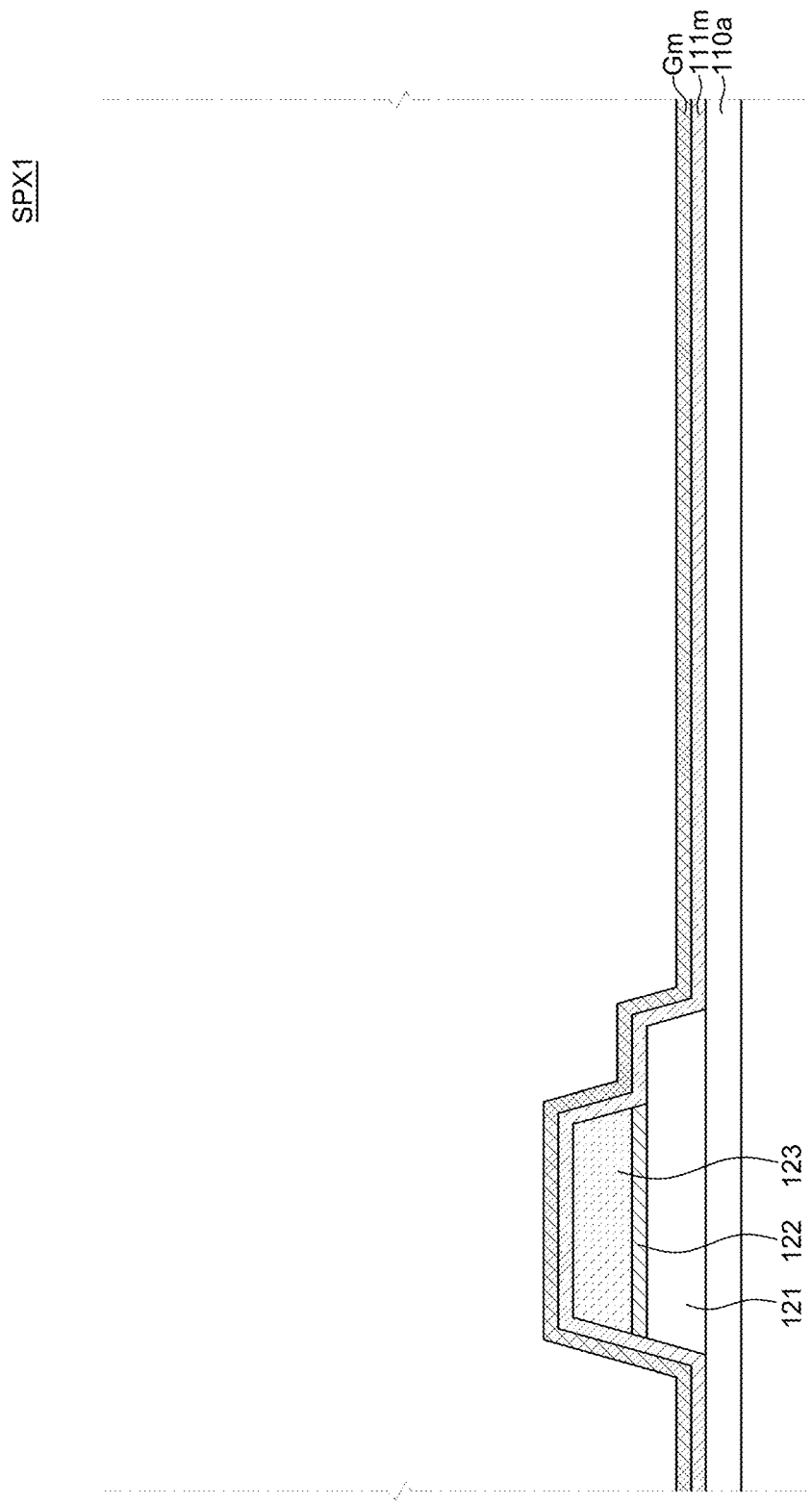
Figure 7C:
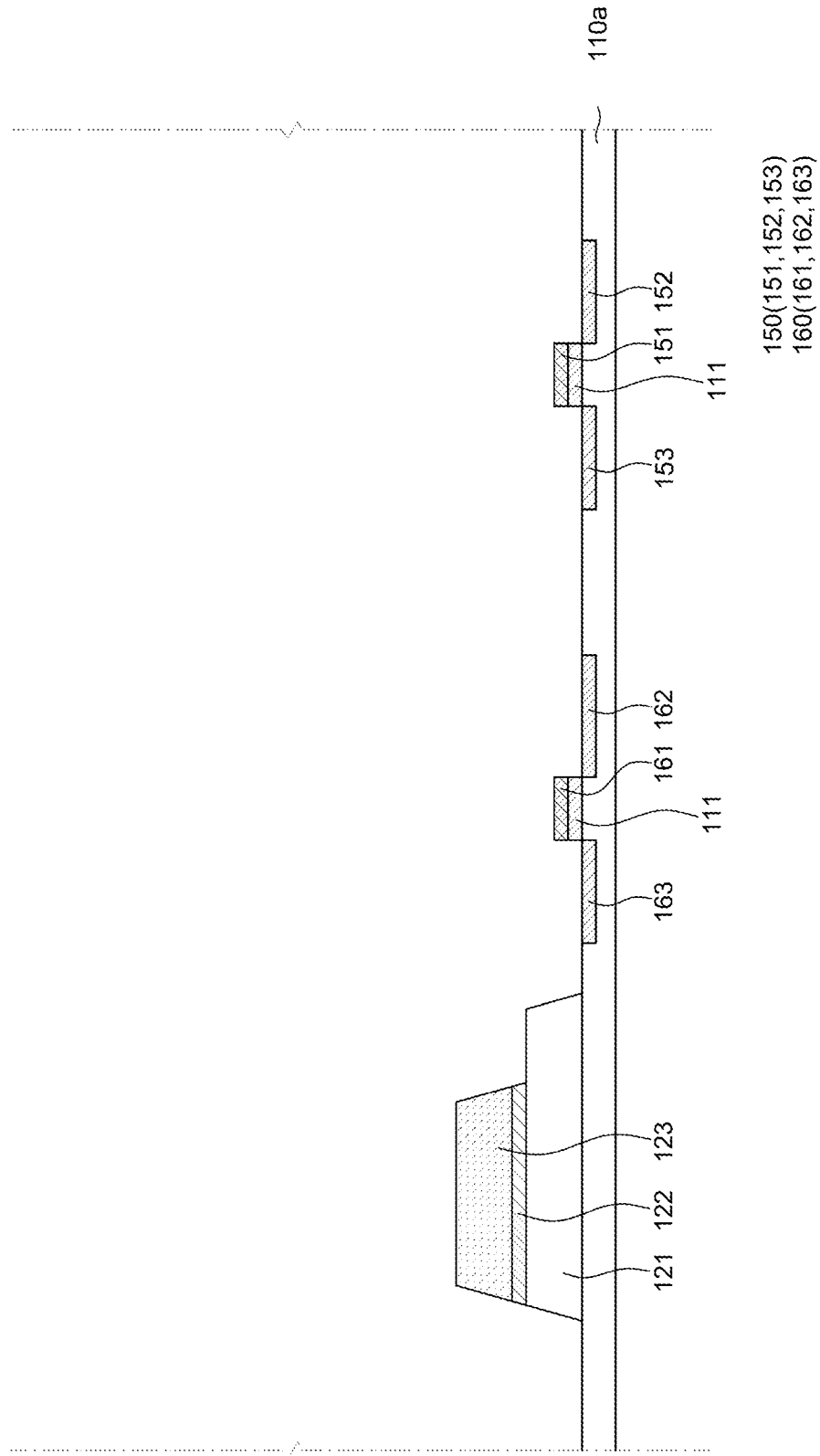
Figure 7D:
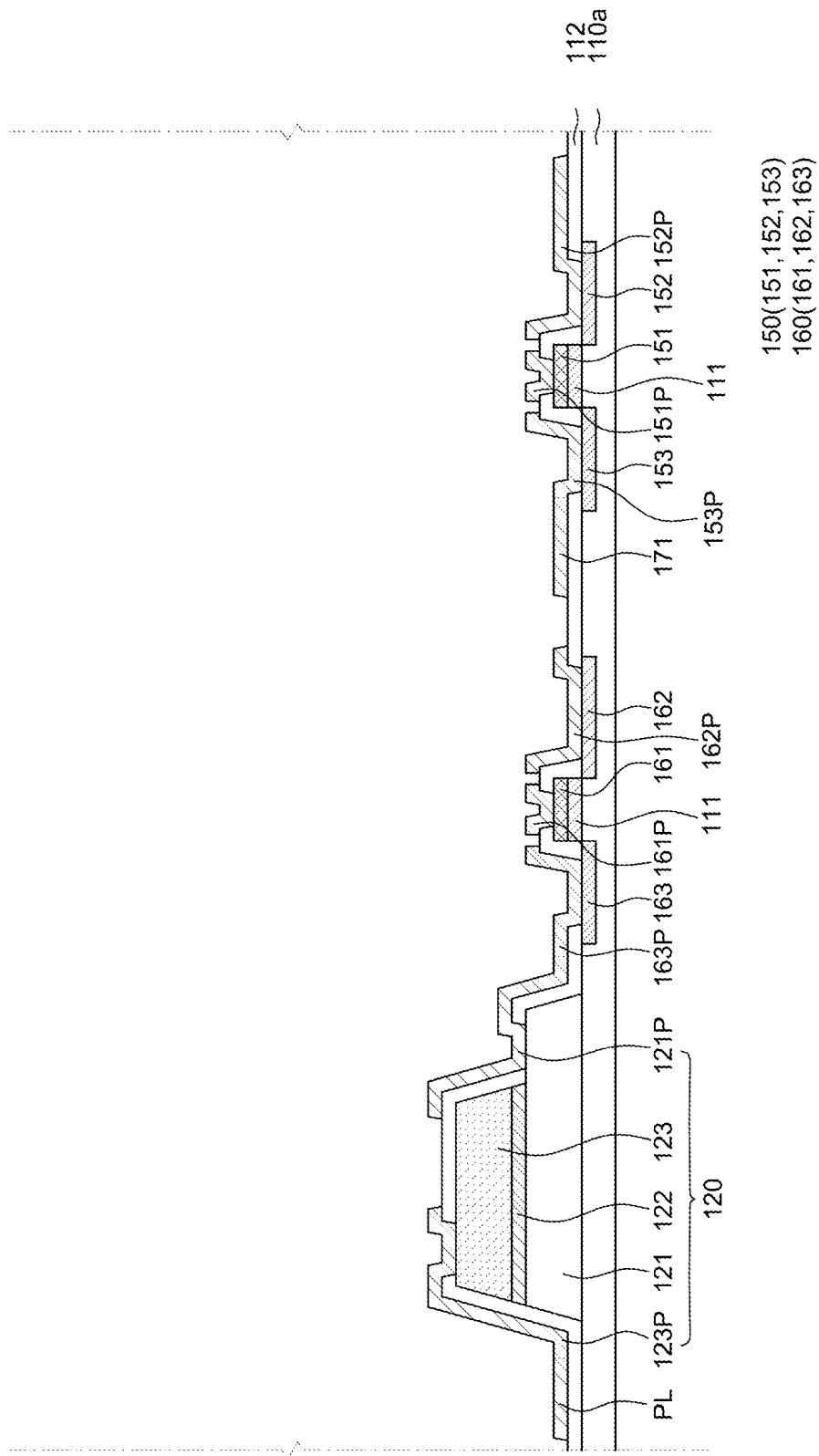
Figure 7E:
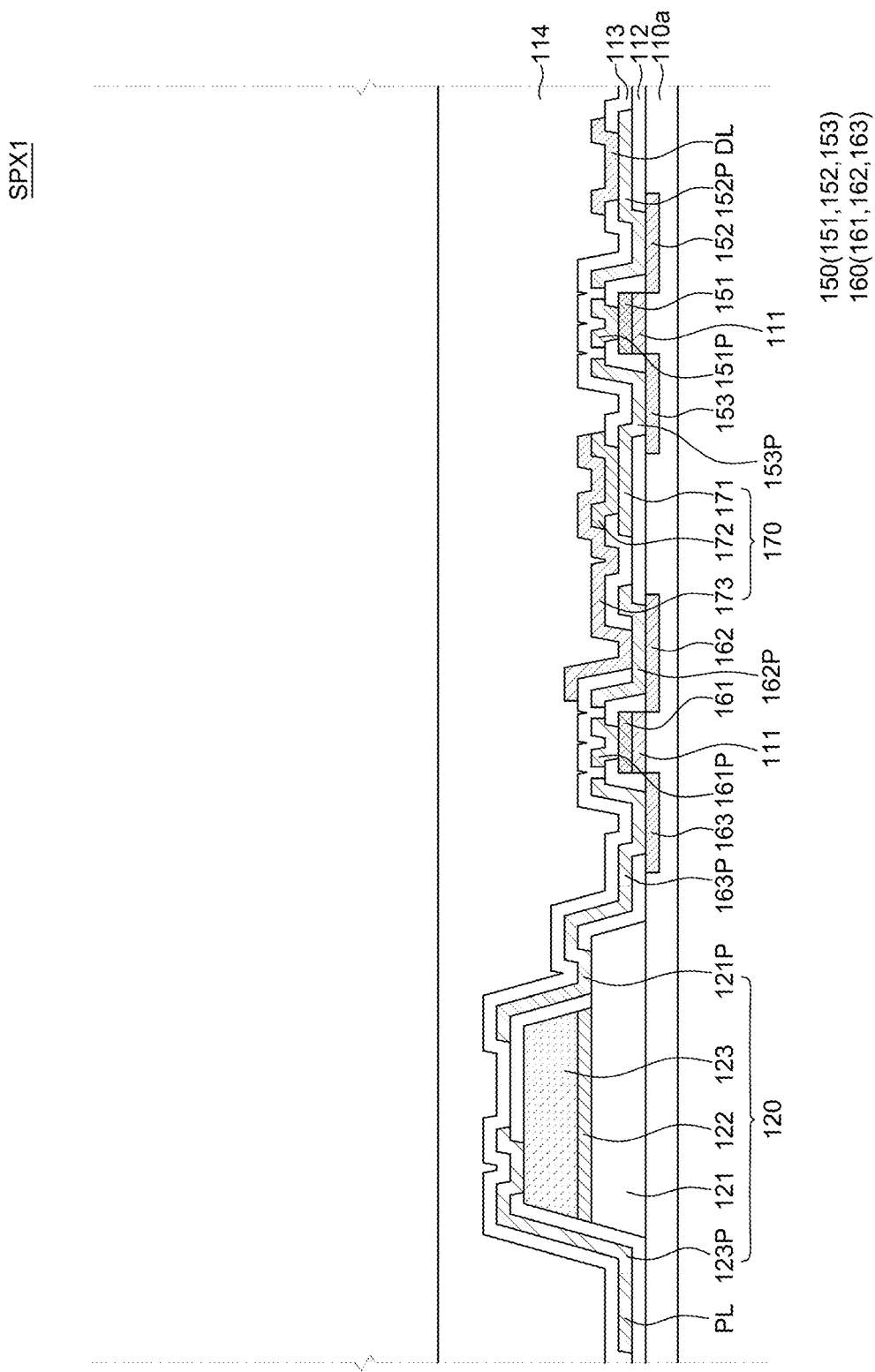
Figure 7F:
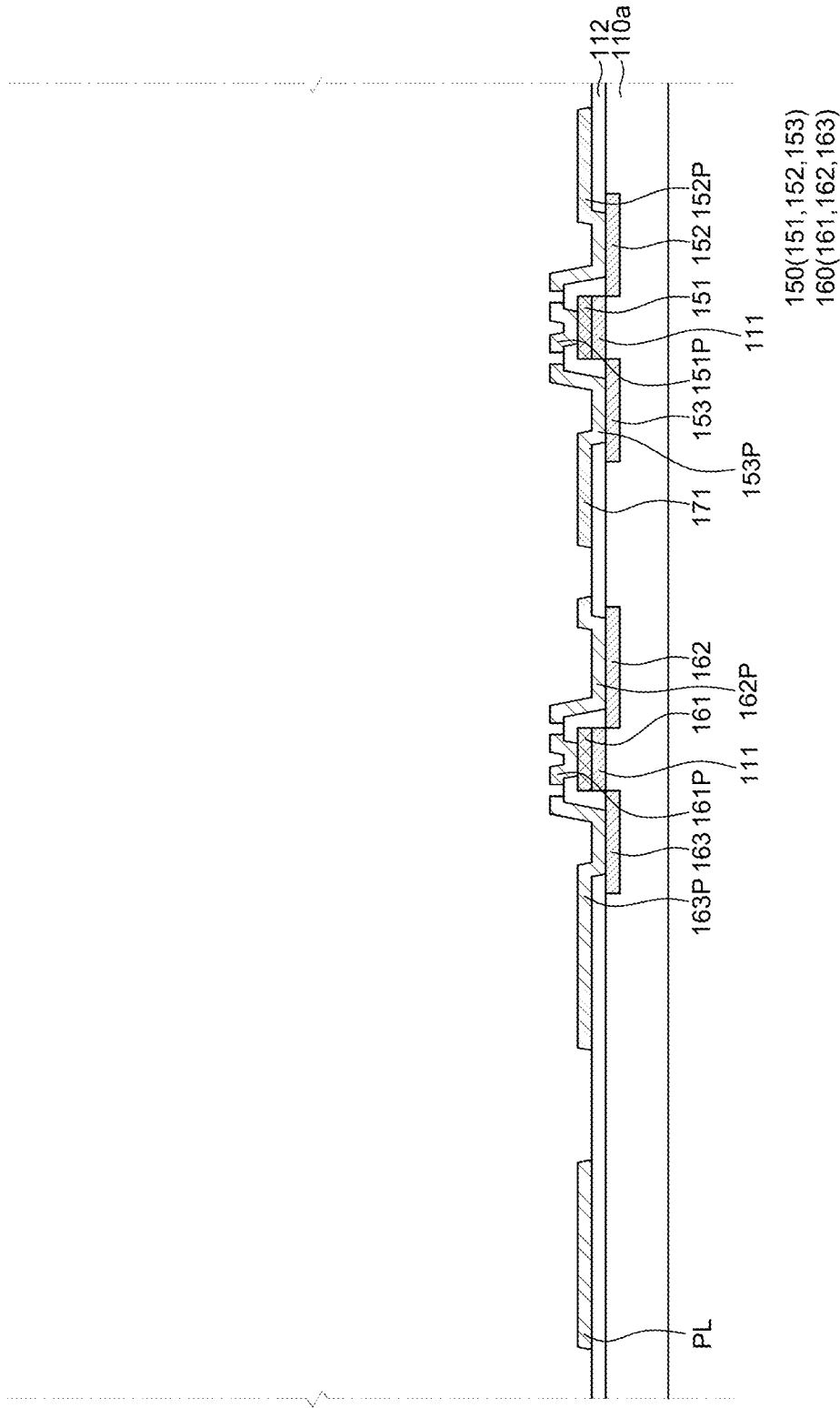
Figure 7G:
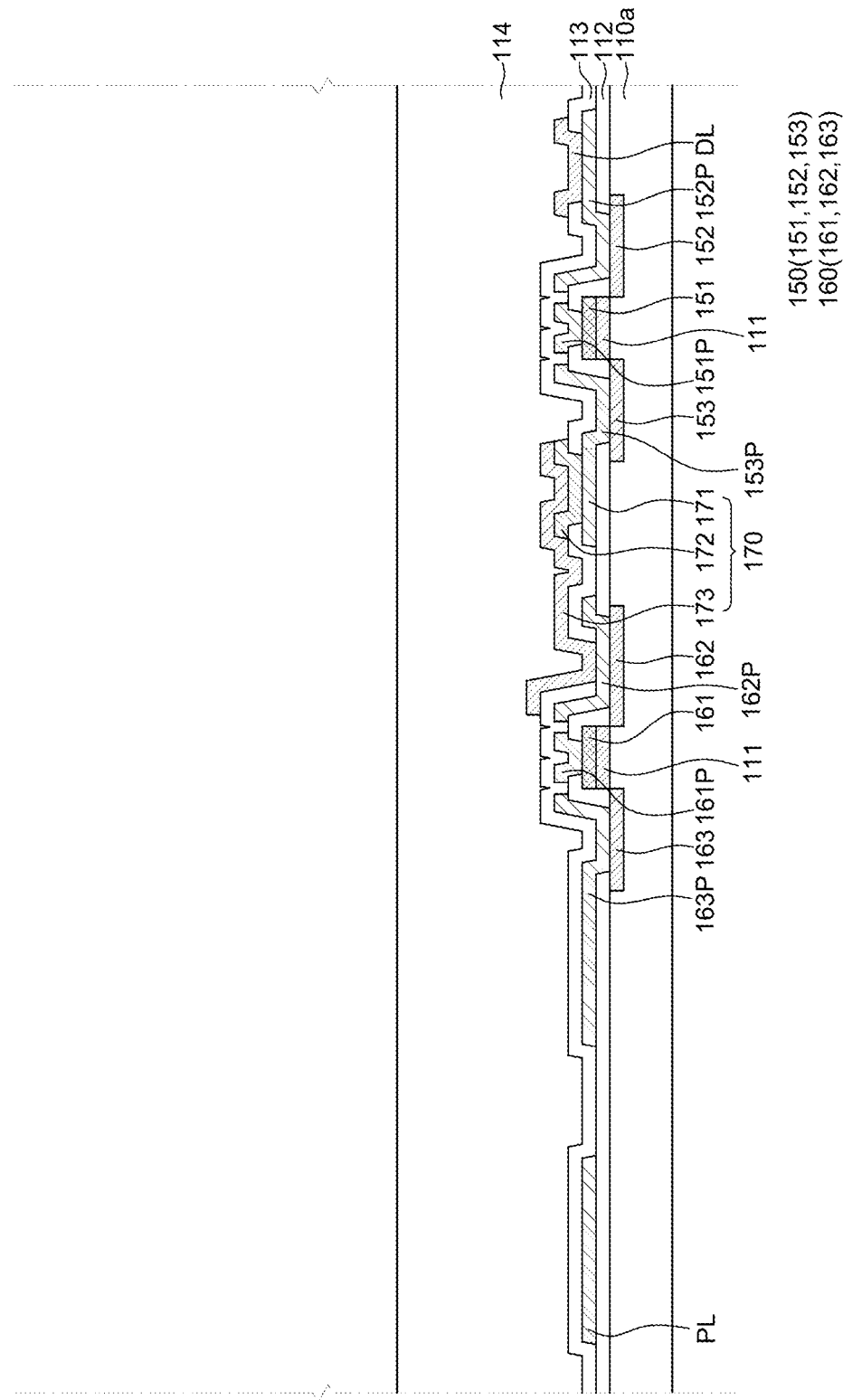
Figure 7H:
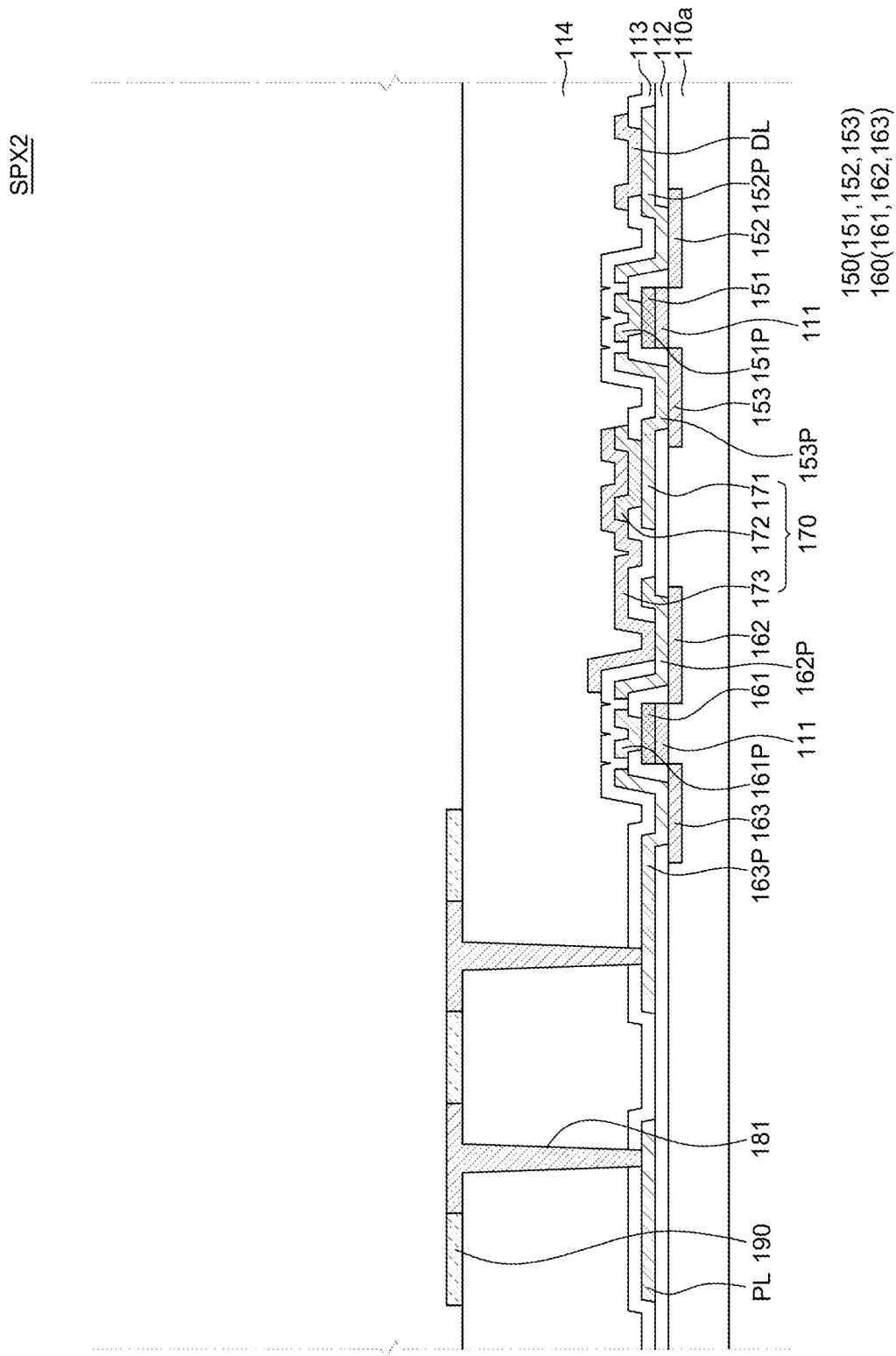
Figure 7I:
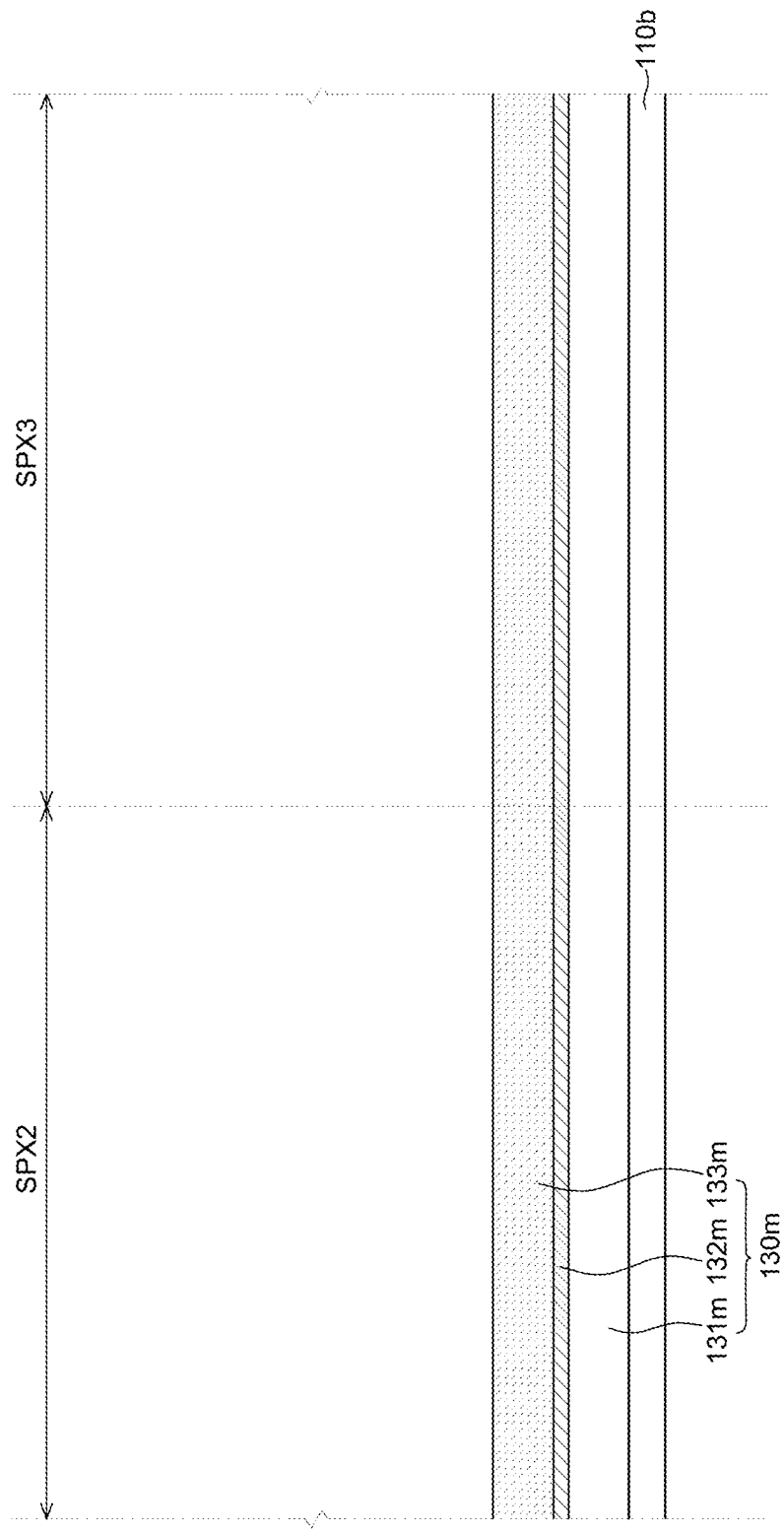
Figure 7J:
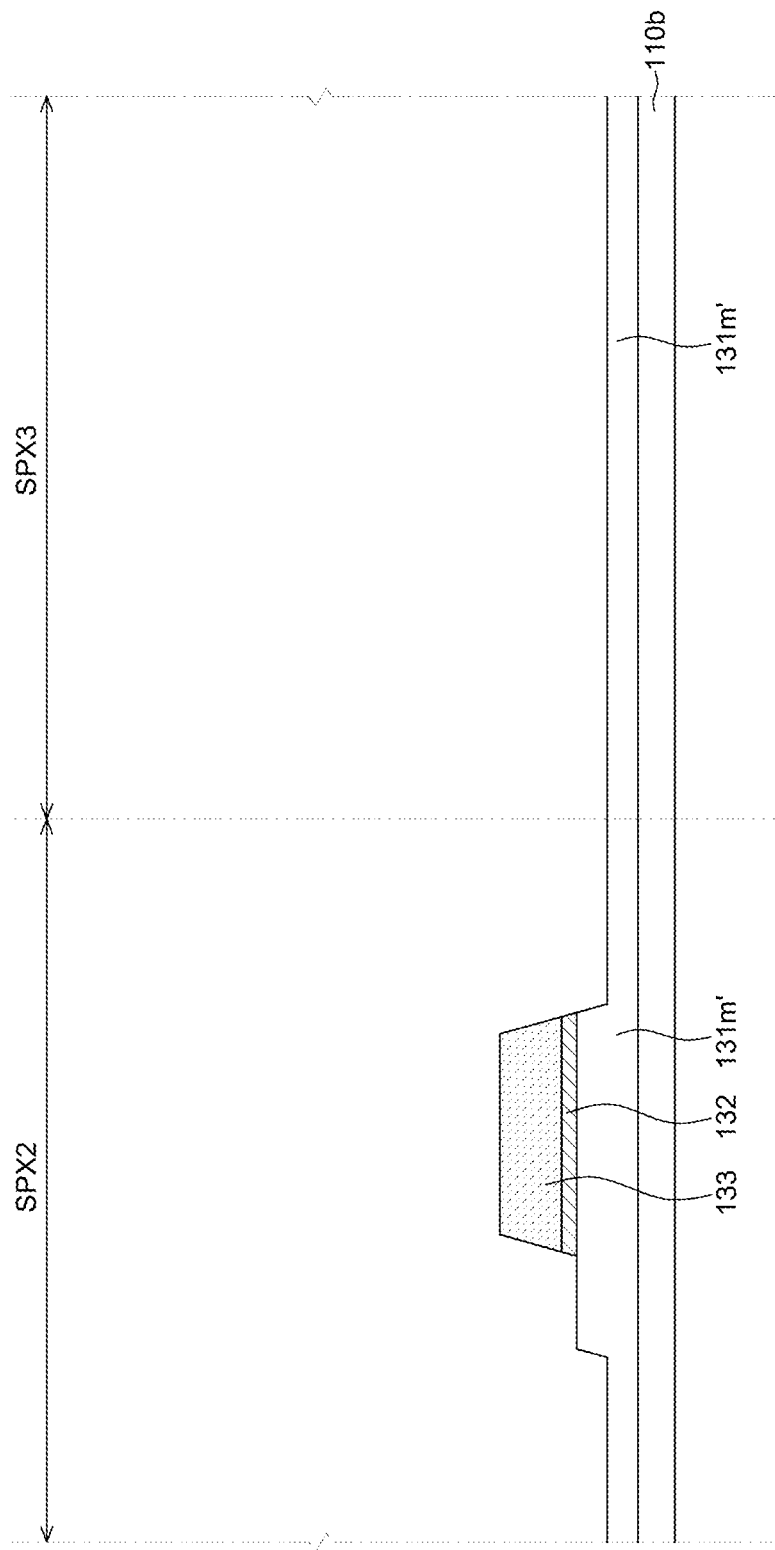
Figure 7K:
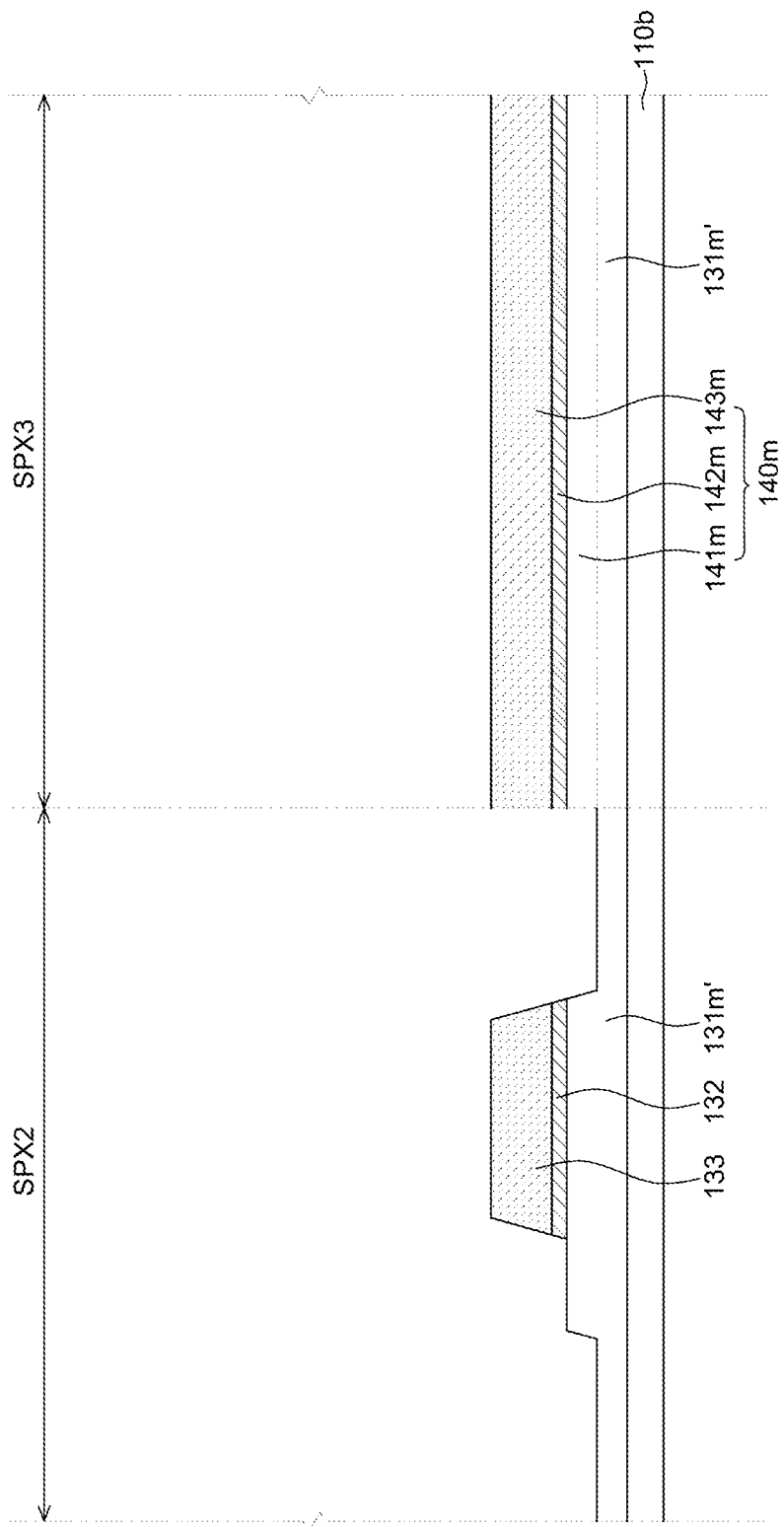
Figure 7M:
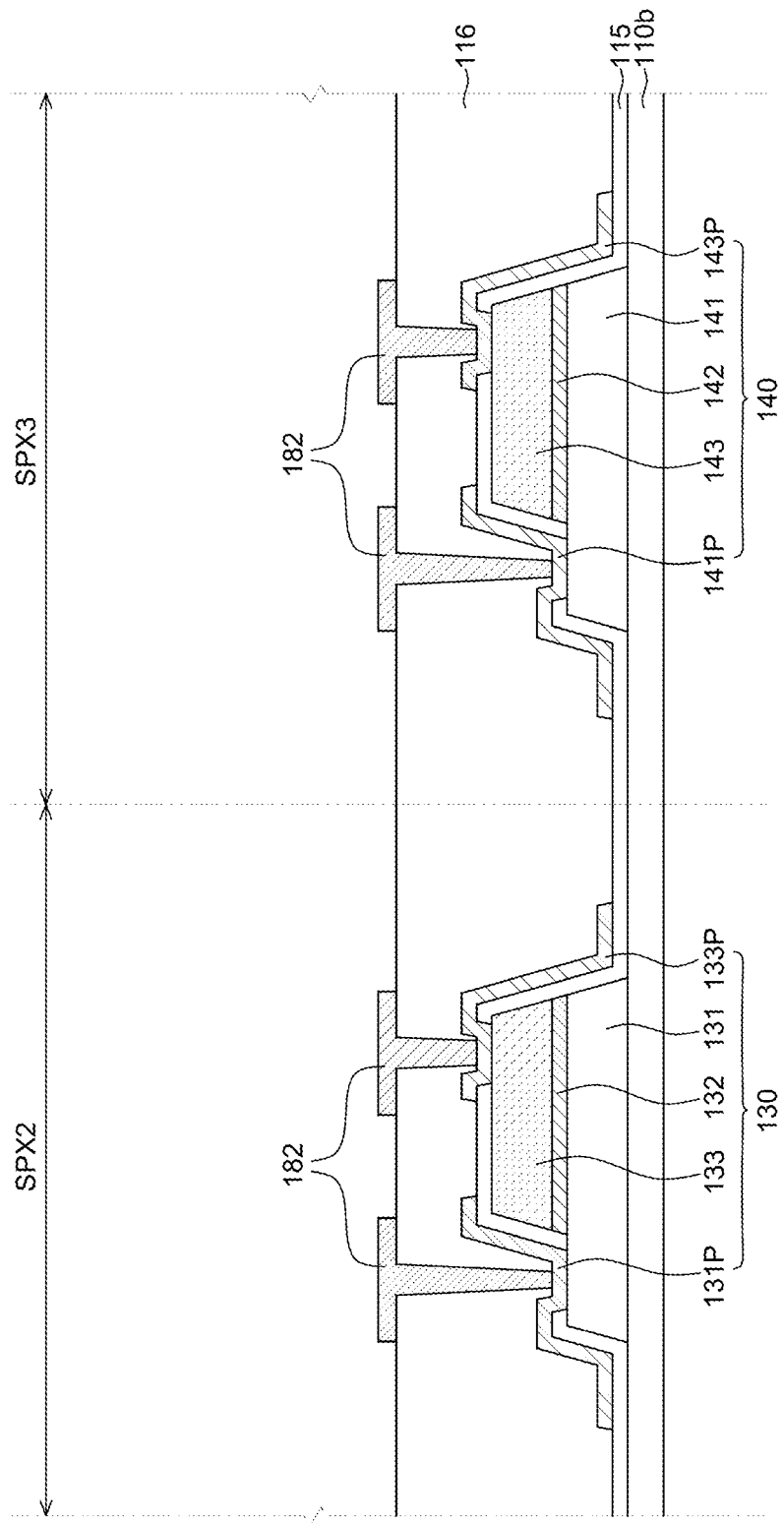
Figure 7N:
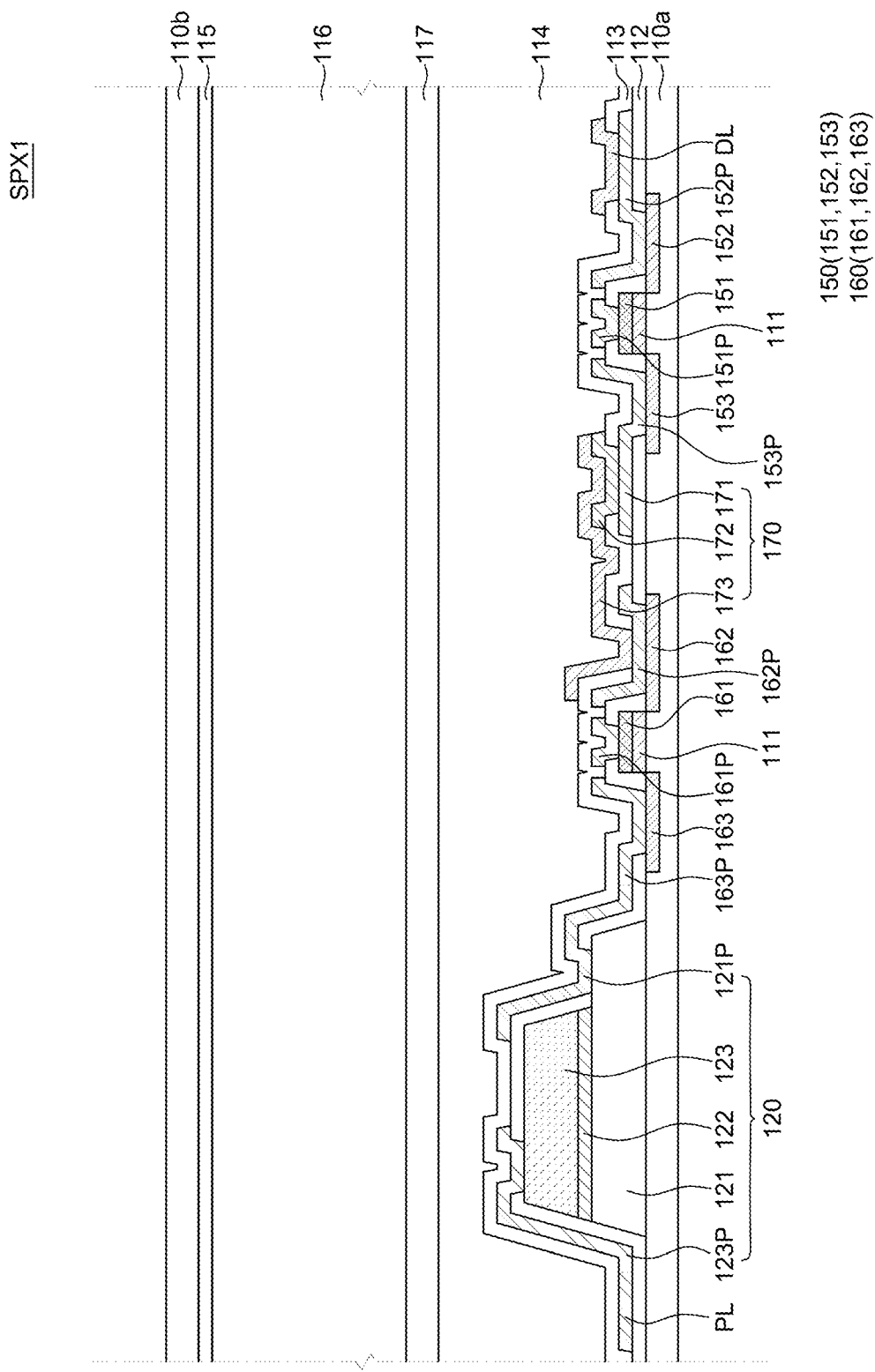
Figure 7O:
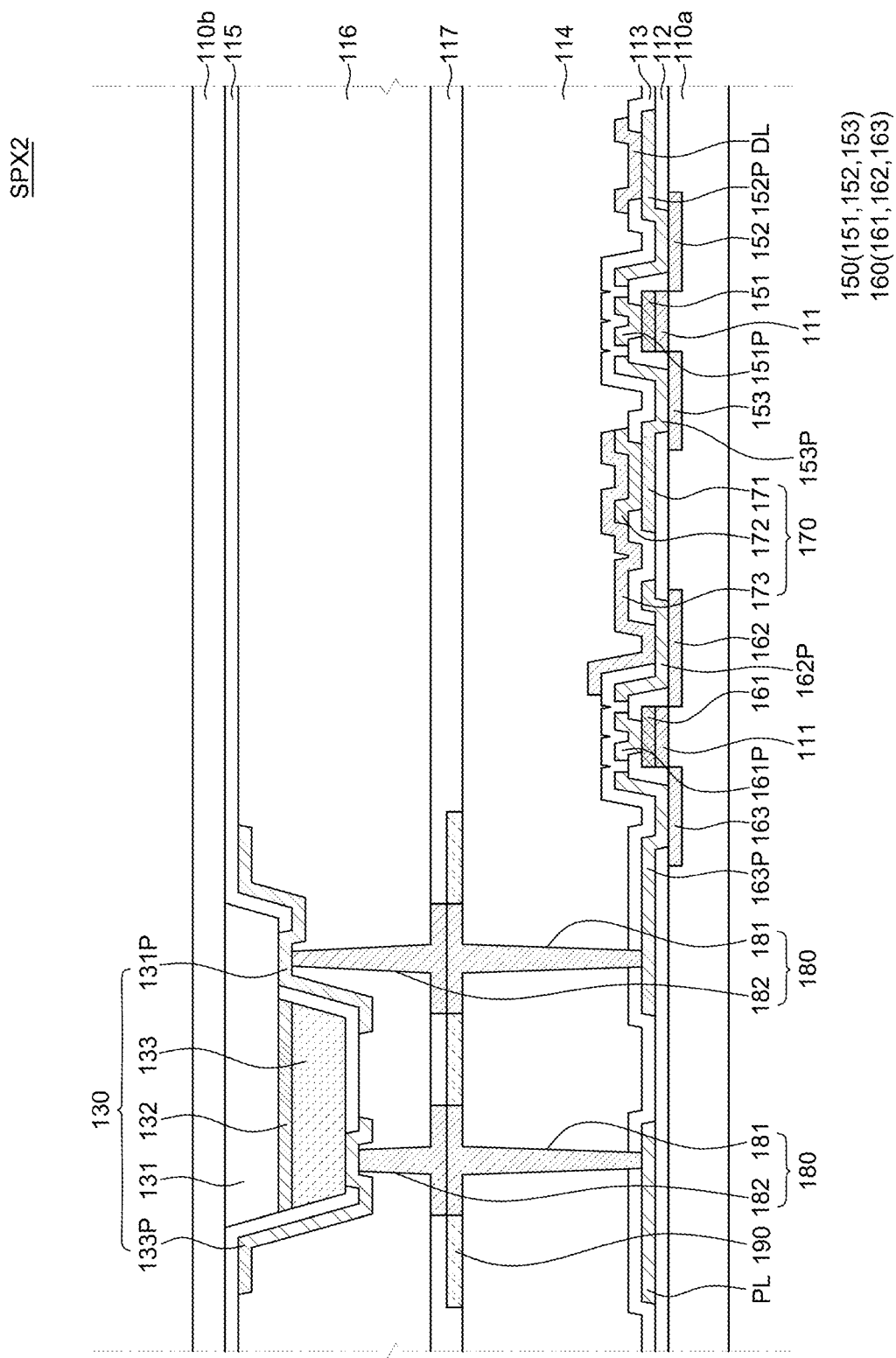

FIGS. 7A to 7O are schematic views of processes for explaining a display device and a manufacturing method of a display device according to an exemplary embodiment of the present disclosure. FIGS. 7A to 7E are schematic cross-sectional views for explaining a process of forming a first LED 120, a plurality of driving units DP, and a plurality of wiring lines in a first sub pixel SPX1 of one surface of a first substrate 110*a*. FIGS. 7F to 7H are schematic cross-sectional views for explaining a process of forming a first connecting unit 181 in a second sub pixel SPX2 of one surface of the first substrate 110*a*. FIGS. 7I to 7M are schematic cross-sectional views for explaining a process of forming a second LED 130 and a third LED 140 on one surface of a second substrate 110*b*. FIGS. 7N and 7O are schematic cross-sectional views for explaining a bonding process of a first substrate 110*a* and a second substrate 110*b*.

A process of forming a first LED 120, a plurality of driving units DP, and a plurality of wiring lines in a first sub pixel SPX1 of one surface of a first substrate 110*a* will be described with reference to FIGS. 7A to 7E.

Referring to FIG. 7A, a first epitaxial layer 120*m* is formed on one entire surface of the first substrate 110*a*.

The first epitaxial layer 120*m* is used to form the plurality of first LEDs 120 of the first substrate 110*a*. The first epitaxial layer 120*m* has a structure in which materials which form a first n-type semiconductor layer 121, a first light emitting layer 122, and a first p-type semiconductor layer 123 of the plurality of first LEDs 120 are sequentially laminated. For example, the first epitaxial layer 120*m* may be formed of a first n-type semiconductor material layer 121*m*, the first light emitting material layer 122*m*, and a first p-type semiconductor material layer 123*m*.

In this case, a first n-type semiconductor material layer 121*m*, a first light emitting material layer 122*m*, and a first p-type semiconductor material layer 123*m* of the first epitaxial layer 120*m* may be grown on one surface of the first substrate 110*a* by a metal organic chemical vapor deposition (MOCVD) method or a sputtering method, but the growth method of the first epitaxial layer 120*m* is not limited thereto.

In the meantime, the first LED 120 is a red LED which emits red light, as described above. The first light emitting material layer 122*m* which is a material forming the first light emitting layer 122 of the first LED 120 is configured to emit red light. In this case, the growth efficiency of the first epitaxial layer 120*m* including the first light emitting material layer 122*m* may vary depending on the type of the first substrate 110*a*.

For example, when the first substrate 110*a* is a sapphire substrate, it may be difficult to grow the first epitaxial layer 120*m* including the first light emitting material layer 122*m* which is configured to emit red light on the first substrate 110*a*. In contrast, when the first substrate 110*a* is a gallium arsenide substrate or a gallium phosphide substrate, the first epitaxial layer 120*m* including the first light emitting material layer 122*m* which is configured to emit red light may be efficiently grown on the first substrate 110*a*. Therefore, since the first LED 120 is a red LED which emits red light, the first substrate 110a may be formed of a gallium arsenide substrate or a gallium phosphide substrate which may efficiently grow the red LED, but is not limited thereto.

In this case, the light emitted from the plurality of LEDs 120, 130, and 140 may be discharged not to the first substrate 110a, but to the second substrate 110b. Therefore, the first substrate 110a may be formed of an opaque substrate so as not to emit light from the plurality of LEDs 120, 130, and 140 through the first substrate 110a.

Referring to FIG. 7B, the first epitaxial layer 120m is etched to form a first n-type semiconductor layer 121, a first light emitting layer 122, and a first p-type semiconductor layer 123 of the first LED 120, a first gate electrode 151 of the first semiconductor element 150, and a second gate electrode 161 of the second semiconductor element 160 may be formed.

First, the first p-type semiconductor material layer 123m which is an uppermost end of the first epitaxial layer 120m may be etched. For example, the first p-type semiconductor material layer 123m is left only in an area overlapping the first p-type semiconductor layer 123 of the first LED 120 and the first p-type semiconductor material layer 123m may be etched in the remaining area. Therefore, the first p-type semiconductor layer 123 which is formed of the first p-type semiconductor material layer 123m may be formed.

Next, after etching the first p-type semiconductor material layer 123m, the first light emitting material layer 122m may be etched. For example, the first light emitting material layer 122m is left only in an area overlapping the first p-type semiconductor layer 123 and the first light emitting material layer 122m may be etched in the remaining area. Therefore, the first light emitting layer 122 which is formed of the first light emitting material layer 122m may be formed.

Next, after etching the first p-type semiconductor material layer 123m and the first light emitting material layer 122m, a part of the first n-type semiconductor material layer 121m which is exposed from the first p-type semiconductor layer 123 and the first light emitting layer 122 may be selectively etched. For example, the first n-type semiconductor material layer 121m may be etched leaving only the first n-type semiconductor material layer 121m overlapping the first p-type semiconductor layer 123 and the first light emitting layer 122 and a partial first n-type semiconductor material layer 121m which outwardly protrudes from the first p-type semiconductor layer 123 and the first light emitting layer 122. Therefore, the first n-type semiconductor layer 121 which partially outwardly protrudes from the first p-type semiconductor layer 123 and the first light emitting layer 122 may be formed.

Next, a gate insulating material layer 111m and a gate electrode material layer Gm are sequentially formed to cover the first n-type semiconductor layer 121, the first light emitting layer 122, and the first p-type semiconductor layer 123.

The gate insulating material layer 111m is a material which forms the gate insulating layer 111 and may be configured by a single layer or a double layer of silicon oxide SiOx or silicon nitride SiNx, but is not limited thereto.

The gate electrode material layer Gm is a material which forms the first gate electrode 151 of the first semiconductor element 150 and the second gate electrode 161 of the second semiconductor element 160 of each of the plurality of driving units DP. For example, the gate electrode material layer Gm may be formed of a conductive material such as polysilicon and molybdenum (Mo), but is not limited thereto.

Referring to FIG. 7C, the gate electrode material layer Gm and the gate insulating material layer 111m are etched to form the first gate electrode 151, the second gate electrode 161, and the gate insulating layer 111 and forms the first source region 152 and the first drain region 153 and the second source region 162 and the second drain region 163.

First, the gate electrode material layer Gm is etched to form the first gate electrode 151 and the second gate electrode 161.

Next, the gate insulating material layer 111m is etched in an area excluding an area overlapping the first gate electrode 151 and the second gate electrode 161 to form the gate insulating layer 111. The gate insulating material layer 111m is left only below the first gate electrode 151 and the second gate electrode 161 and the gate insulating material layer 111m is etched in the remaining area to form the gate insulating layer 111.

Next, the first source region 152, the first drain region 153, the second source region 162, and the second drain region 163 may be formed. Specifically, a photoresist may be formed excluding an area overlapping the first source region 152, the first drain region 153, the second source region 162, and the second drain region 163. n-type or p-type impurities may be injected into the area exposed from the photoresist. Finally, after injecting the n-type or p-type impurities, an annealing process may be performed for electrical activation. Therefore, the photoresist is formed to inject the n-type or p-type impurities into the first source region 152, the first drain region 153, the second source region 162, and the second drain region 163.

Therefore, the formation of the first semiconductor element 150 which is formed of the first gate electrode 151, the first source region 152, and the first drain region 153 and the second semiconductor element 160 which is formed of the second gate electrode 161, the second source region 162, and the second drain region 163 may be completed.

In the meantime, depending on the type of the first substrate 110a, the first source region 152 and the first drain region 153 of the first semiconductor element 150 and the second source region 162 and the second drain region 163 of the second semiconductor element 160 may be directly formed on the first substrate 110a, but may be formed on the first n-type semiconductor material layer 121m of the first LED 120.

For example, when the first substrate 110a is a gallium arsenic substrate, the n-type or p-type impurity may not be appropriately injected into the gallium arsenic substrate so that defect of the first source region 152, the first drain region 153, the second source region 162, and the second drain region 163 may be caused. Therefore, the reliability of the first semiconductor element 150 and the second semiconductor element 160 which are formed by injecting the n-type or p-type impurities in the gallium arsenic substrate may be low. Therefore, when the first n-type semiconductor material layer 121m is etched, the first n-type semiconductor material layer 121m may be left in an area where the first semiconductor element 150 and the second semiconductor element 160 are to be formed. Further, the p-type impurity is injected into the first n-type semiconductor material layer 121m to form the first source region 152, the first drain region 153, the second source region 162, and the second drain region 163 having a low degree of defectiveness. However, the design and the type of the first semiconductor element 150 and the second semiconductor element 160 may vary depending on the type of the first substrate 110a, but is not limited thereto.

Referring to FIG. 7D, the first passivation layer 112 is formed on the first semiconductor element 150, the second semiconductor element 160, and the first n-type semiconductor layer 121, the first light emitting layer 122, and the first p-type semiconductor layer 123 of the first LED 120.

A first passivation material layer may be formed to cover the first semiconductor element 150, the second semiconductor element 160, and the first LED 120.

Next, the first passivation material layer which is formed to cover the first semiconductor element 150, the second semiconductor element 160, and the first LED 120 is etched to form a contact hole. For example, a contact hole which exposes the first gate electrode 151, the first source region 152, and the first drain region 153 of the first semiconductor element 150, a contact hole which exposes the second gate electrode 161, the second source region 162, and the second drain region 163 of the second semiconductor element 160, and a contact hole which exposes the first n-type semiconductor layer 121 and the first p-type semiconductor layer 123 of the first LED 120 may be formed. Therefore, the formation of the first passivation layer 112 may be completed by forming contact holes which partially expose the first semiconductor element 150, the second semiconductor element 160, and the first LED 120 on the first passivation material layer.

Next, a gate line GL, a power line PL, a first gate pad electrode 151P, a first source pad electrode 152P, a first drain pad electrode 153P, a second gate pad electrode 161P, a second source pad electrode 162P, a second drain pad electrode 163P, a first n-type electrode 121P, and a first p-type electrode 123P are formed on the first passivation layer 112.

Specifically, a conductive material layer may be formed on the first passivation layer 112.

Next, a plurality of gate lines GL, a plurality of power lines PL, the first gate pad electrode 151P, the first source pad electrode 152P, the first drain pad electrode 153P, the second gate pad electrode 161P, the second source pad electrode 162P, the second drain pad electrode 163P, the first n-type electrode 121P, and the first p-type electrode 123P are formed by etching the conductive material layer.

For example, the conductive material layer is etched excluding a conductive material layer which is disposed to fill the contact hole of the first passivation layer 112 which exposes the first gate electrode 151, the first source region 152, and the first drain region 153 of the first semiconductor element 150 and the second gate electrode 161, the second source region 162, and the second drain region 163 of the second semiconductor element 160 of each of the plurality of driving units DP. By doing this, the first gate pad electrode 151P, the first source pad electrode 152P, the first drain pad electrode 153P, the second gate pad electrode 161P, the second source pad electrode 162P, and the second drain pad electrode 163P may be formed.

The conductive material layer is etched to form a first capacitor electrode 171 which is integrally formed with the first drain pad electrode 153P and the second gate pad electrode 161P.

When the second drain pad electrode 163P is formed, the first n-type electrode 121P which is integrally formed with the second drain pad electrode 163P and is in contact with the first n-type semiconductor layer 121 of the first LED 120 may also be formed.

Concurrently, the conductive material layer is etched to form the gate line GL which is integrally formed with the first gate pad electrode 151P and horizontally extends.

The first n-type electrode 121P and the first p-type electrode 123P may be formed on the first passivation layer 112 which partially exposes the first n-type semiconductor layer 121 and the first p-type semiconductor layer 123 of the first LED 120. Therefore, the formation of the first LED 120 which includes the first n-type semiconductor layer 121, the first light emitting layer 122, the first p-type semiconductor layer 123, the first n-type electrode 121P, and the first p-type electrode 123P may be completed.

In this case, when the first p-type electrode 123P is formed, the power line PL which is integrally formed with the first p-type electrode 123P and horizontally extends may also be formed.

Therefore, after forming the first passivation layer 112 on the first semiconductor element 150, the second semiconductor element 160, and the first n-type semiconductor layer 121, the first light emitting layer 122, and the first p-type semiconductor layer 123 of the first LED 120, a plurality of contact holes is formed to form the first passivation layer 112.

Further, after forming the conductive material layer to fill the plurality of contact holes of the first passivation layer 112 on the first passivation layer 112, the conductive material layer is etched to form the gate line GL, the power line PL, the first gate pad electrode 151P, the first source pad electrode 152P, the first drain pad electrode 153P, the second gate pad electrode 161P, the second source pad electrode 162P, the second drain pad electrode 163P, the first n-type electrode 121P, and the first p-type electrode 123P.

Referring to FIG. 7E, a second passivation material layer may be formed so as to cover a plurality of gate lines GL, a plurality of power lines PL, the first gate pad electrode 151P, the first source pad electrode 152P, the first drain pad electrode 153P, the second gate pad electrode 161P, the second source pad electrode 162P, the second drain pad electrode 163P, the first n-type electrode 121P, and the first p-type electrode 123P.

Next, the second passivation material layer is etched to form a contact hole. For example, in order to form a contact hole for connecting the second source pad electrode 162P to a second capacitor electrode 173 which will be formed later, the second passivation material layer which covers the upper surface of the second source pad electrode 162P may be partially etched.

Further, in order to form a dielectric layer 172 of the capacitor, the second passivation material layer which covers the first capacitor electrode 171 may be partially etched.

In order to form a contact hole for connecting the first source pad electrode 152P and the data line DL, the second passivation material layer which covers the upper surface of the first source pad electrode 152P may be partially etched.

Therefore, in an area overlapping the first capacitor electrode 171, the second source pad electrode 162P, and the first source pad electrode 152P, the second passivation material layer is etched to complete the formation of the second passivation layer 113.

Next, the common line CL, the data line DL, the dielectric layer 172, and the second capacitor electrode 173 are formed on the second passivation layer 113 and the first protective layer 114 is formed.

The dielectric layer 172 may be formed so as to cover the upper surface of the first capacitor electrode 171 which is exposed from the second passivation layer 113.

Next, a conductive material layer may be formed on the dielectric layer 172 and the second passivation layer 113.

Next, the conductive material layer is etched excluding the area overlapping the dielectric layer 172 and the second source pad electrode 162P to form the second capacitor electrode 173. Therefore, the formation of the capacitor 170 which is formed of the first capacitor electrode 171, the dielectric layer 172, and the second capacitor electrode 173 may be completed.

Concurrently, the conductive material layer is etched to form a common line CL which is integrally formed with the second capacitor electrode 173.

Further, the conductive material layer is etched to form the data line DL which is in contact with the first source pad electrode 152P exposed from the second passivation layer 113.

Next, the first protective layer 114 may be formed on the capacitor 170, the common line CL, and the data line DL. The first protective layer 114 may be formed so as to cover the plurality of driving units DP, the plurality of wiring lines, and the plurality of first LEDs 120 of one surface of the first substrate 110a.

Hereinafter, a process of forming a first connecting unit 181 in a second sub pixel SPX2 of one surface of the first substrate 110a will be described with reference to FIGS. 7F to 7H. The process of forming the first connecting unit 181 in the second sub pixel SPX2 and the third sub pixel SPX3 is the same so that hereinafter, for the convenience of description, only the process of forming the first connecting unit 181 in the second sub pixels SPX2 is illustrated.

Referring to FIG. 7F, the processes for forming the first semiconductor element 150, the second semiconductor element 160, and the first passivation layer 112 in each of the second sub pixel SPX2 and the third sub pixels SPX3 on one surface of the first substrate 110a are the same as the process of forming the driving unit DP of the first sub pixel SPX1.

After completing the formation of the first passivation layer 112, the gate line GL, the power line PL, the first gate pad electrode 151P, the first source pad electrode 152P, the first drain pad electrode 153P, the second gate pad electrode 161P, the second source pad electrode 162P, and the second drain pad electrode 163P are formed on the first passivation layer 112.

Specifically, a conductive material layer may be formed on the first passivation layer 112.

Next, the conductive material layer is etched to form a plurality of gate lines GL, a plurality of power lines PL, the first gate pad electrode 151P, the first source pad electrode 152P, the first drain pad electrode 153P, the second gate pad electrode 161P, the second source pad electrode 162P, and the second drain pad electrode 163P.

In this case, the plurality of LEDs 120, 130, and 140 is not formed in the second sub pixels SPX2 and the third sub pixels SPX3 on one surface of the first substrate 110a, so that the n-type electrode and the p-type electrode are not formed and the first n-type electrode 121P and the first p-type electrode 123P are formed only in the first sub pixel SPX1 in which the first LED 120 is disposed.

Next, referring to FIG. 7G, the second passivation layer 113 is formed on the plurality of gate lines GL, the plurality of power lines PL, the first gate pad electrode 151P, the first source pad electrode 152P, the first drain pad electrode 153P, the second gate pad electrode 161P, the second source pad electrode 162P, and the second drain pad electrode 163P.

In this case, the second passivation layer 113 may be formed to have a contact hole which exposes the first drain pad electrode 153P and the first source pad electrode 152P.

Next, the common line CL, the data line DL, the dielectric layer 172, and the second capacitor electrode 173 are formed on the second passivation layer 113 and the first protective layer 114 is formed.

Next, referring to FIG. 7H, the first connecting unit 181 is formed on the first protective layer 114.

First, the first protective layer 114 and the second passivation layer 113 are etched to form a contact hole which exposes the second drain pad electrode 163P and the power line PL.

Next, a conductive material layer may be formed on the first protective layer 114 to fill the contact hole of the first protective layer 114. The conductive material layer is etched to form the first connecting unit 181 connected to the second drain pad electrode 163P and the first connecting unit 181 connected to the power line PL.

Finally, the reflective layer 190 is formed on the first protective layer 114. Specifically, the reflective layer 190 may be formed so as to overlap the second sub pixel SPX2 and the third sub pixel SPX3. The reflective layer 190 may be formed to overlap the second LED 130 and the third LED 140 formed on the second substrate 110b which is bonded such that one surface is opposite to one surface of the first substrate 110a.

Hereinafter, a process of forming a second LED 130 and a third LED 140 on one surface of a second substrate 110b will be described with reference to FIGS. 7I to 7M.

Referring to FIG. 7I, a second epitaxial layer 130m is formed on one entire surface of the second substrate 110b.

The second epitaxial layer 130m is used to form the plurality of second LEDs 130 of the second substrate 110b. The second epitaxial layer 130m has a structure in which materials which form a second n-type semiconductor layer 131, a second light emitting layer 132, and a second p-type semiconductor layer 133 of the plurality of second LEDs 130 are sequentially laminated. For example, the second epitaxial layer 130m may be formed of the second n-type semiconductor material layer 131m, the second light emitting material layer 132m, and the second p-type semiconductor material layer 133m.

In the meantime, the second LED 130 is a blue LED which emits blue light, as described above. The second light emitting material layer 132m which is a material forming the second light emitting layer 132 of the second LED 130 is configured to emit blue light. In this case, the growth efficiency of the second epitaxial layer 130m including the second light emitting material layer 132m may vary depending on the type of the second substrate 110b, similarly to the first epitaxial layer 120m.

For example, when the second substrate 110b is a gallium arsenic substrate, it may be difficult to grow the second epitaxial layer 130m including the second light emitting material layer 132m which is configured to emit blue light on the second substrate 110b. In contrast, when the second substrate 110b is a sapphire substrate, the second epitaxial layer 130m including the second light emitting material layer 132m which is configured to emit blue light may be efficiently grown on the first substrate 110a.

In the meantime, the light emitted from the plurality of LEDs 120, 130, and 140 including the second LED 130 is discharged toward the second substrate 110b. That is, the second substrate 110b may be formed of a transparent substrate and efficiently grow the blue LED. For example, the second substrate 110b may efficiently grow the blue LED and may be formed of a transparent sapphire substrate or a gallium nitride substrate, but is not limited thereto.

Referring to FIG. 7J, in the second sub pixel SPX2, the second epitaxial layer 130m is etched to form a part of the second LEDs 130 and in the third sub pixels SPX3, the second epitaxial layer 130m is etched leaving only a lower portion 131m' of the second n-type semiconductor material 131m.

First, the second p-type semiconductor material layer 133m and the second light emitting material layer 132m of the second epitaxial layer 130m are partially etched in the second sub pixel SPX2 to form the second p-type semiconductor layer 133 and the second light emitting layer 132 of the second LED 130.

Next, only an upper portion of the second n-type semiconductor material layer 131m which is exposed from the second p-type semiconductor layer 133 and the second light emitting layer 132 is etched. The lower portion 131m' of the second n-type semiconductor material layer 131m may be left so as to cover the entire one surface of the second substrate 110b.

In the third sub pixel SPX3, the entire second p-type semiconductor material layer 133m, the entire second light emitting material layer 132m, and only an upper portion of the second n-type semiconductor material layer 131m of the second epitaxial layer 130m are etched. In the third sub pixel SPX3, only the lower portion 131m' of the second n-type semiconductor material layer 131m may be left.

Next, referring to FIG. 7K, a third epitaxial layer 140m is formed only in an area overlapping the third sub pixel SPX3 excluding the second sub pixel SPX2.

The third epitaxial layer 140m is used to form the plurality of third LEDs 140 of the second substrate 110b. The third epitaxial layer 140m has a structure in which materials which form a third n-type semiconductor layer 141, a third light emitting layer 142, and a third p-type semiconductor layer 143 of the plurality of third LEDs 140 are sequentially laminated. For example, the third epitaxial layer 140m may be formed of the third n-type semiconductor material layer 141m, the third light emitting material layer 142m, and the third p-type semiconductor material layer 143m.

The third epitaxial layer 140m of the third sub pixels SPX3 may be formed to cover the lower portion 131m' of the second n-type semiconductor material layer 131m. In this case, the second n-type semiconductor material layer 131m and the third n-type semiconductor material layer 141m may be formed of the same material. Therefore, since the second n-type semiconductor material layer 131m performs the same function as the third n-type semiconductor material layer 141m, the third light emitting material layer 142m may be directly formed on the second n-type semiconductor material layer 131m. However, when the second epitaxial layer 130m is etched, the upper surface of the lower portion 131m' of the second n-type semiconductor material layer 131m may be partially damaged due to the influence of the etching. Therefore, when the third light emitting material layer 142m is directly formed on the lower portion 131m' of the second n-type semiconductor material layer 131m, the reliability of the third LED 140 may be low. Therefore, after growing the third n-type semiconductor material layer 141m on the lower portion 131m' of the second n-type semiconductor material layer 131m, the third light emitting material layer 142m and the third p-type semiconductor material layer 143m may be grown.

In the meantime, when the third epitaxial layer 140m is formed in the third sub pixels SPX3, in order to protect the second p-type semiconductor layer 133, the second light emitting layer 132, and the second n-type semiconductor layer 131 of the second LED 130 formed in the second sub pixel SPX2, after forming a protective layer which covers the second sub pixels SPX2, the third epitaxial layer 140m may be formed.

After forming the protective layer on the second p-type semiconductor layer 133 in the second sub pixels SPX2, the third epitaxial layer 140m may be grown on the entire one surface of the second substrate 110b. In this case, a part of the third epitaxial layer 140m formed in the second sub pixel SPX2 may be removed together by removing the protective layer. For example, the protective layer may be formed of silicon oxide SiO2 and the protective layer may be etched using the buffered oxide etchant (BOE) in a state when the third epitaxial layer 140m is formed on the protective layer. Therefore, as the protective layer is etched, a part of the third epitaxial layer 140m which covers the second LED 130 may be removed from the second sub pixel SPX2.

In the meantime, the third LED 140 is a green LED which emits green light, as described above. The third light emitting material layer 142m which is a material forming the third light emitting layer 142 of the third LED 140 is configured to emit green light. In this case, the growth efficiency of the third epitaxial layer 140m including the third light emitting material layer 142m may vary depending on the type of the second substrate 110b.

However, in the second substrate 110b, both the second epitaxial layer 130m for forming the second LED 130 and the third epitaxial layer 140m for forming the third LED 140 are grown, so that the second substrate 110b may be a substrate having a high growth efficiency of both the second epitaxial layer 130m and the third epitaxial layer 140m. For example, the second substrate 110b may efficiently grow the blue LED and the green LED and may be formed of a transparent substrate. Therefore, the second LED 130 and the third LED 140 are formed on one surface of the second substrate 110b.

Next, referring to FIG. 7I, the third epitaxial layer 140m and a lower portion 131m' of the second n-type semiconductor material layer 131m are etched to form the second n-type semiconductor layer 131, the second light emitting layer 132, and the second p-type semiconductor layer 133 of the second LED 130 and the third n-type semiconductor layer 141, the third light emitting layer 142, and the third p-type semiconductor layer 143 of the third LED 140 and also form the third passivation layer 115.

First, in the third sub pixel SPX3, the third p-type semiconductor material layer 143m, the third light emitting material layer 142m, the third n-type semiconductor material layer 141m, and a lower portion 131m' of the second n-type semiconductor material layer 131m of the third epitaxial layer 140m are sequentially etched to form the third p-type semiconductor layer 143, the third light emitting layer 142, and the third n-type semiconductor layer 141 of the third LED 140.

In this case, the third n-type semiconductor layer 141 of the third LED 140 is formed of the lower portion 131m' of the second n-type semiconductor material layer 131m and the third n-type semiconductor material layer 141m. Specifically, the third epitaxial layer 140m for forming the third LED 140 is grown on the lower portion 131m' of the second n-type semiconductor material layer 131m. Further, the third epitaxial layer 140m and the lower portion 131m' of the second n-type semiconductor material layer 131m are etched together to form the third p-type semiconductor layer 143, the third light emitting layer 142, and the third n-type semiconductor layer 141 of the third LED 140. Therefore, the third n-type semiconductor layer 141 of the third LED 140 is defined to be formed of the third n-type semiconductor material layer 141m and the lower portion 131m' of the second n-type semiconductor material layer 131m.

Concurrently, the lower portion 131m' of the second n-type semiconductor material layer 131m is etched from the second sub pixels SPX2 to form the second n-type semiconductor layer 131 of the second LED 130.

Next, the third passivation layer 115 is formed so as to cover the second p-type semiconductor layer 133, the second light emitting layer 132, and the second n-type semiconductor layer 131 of the second LED 130 and the third p-type semiconductor layer 143, the third light emitting layer 142, and the third n-type semiconductor layer 141 of the third LED 140. In this case, the third passivation layer 115 is formed so as to have a contact hole which exposes upper portions of the second p-type semiconductor layer 133 and the second n-type semiconductor layer 131 of the second LED 130 and the third p-type semiconductor layer 143 and the third n-type semiconductor layer 141 of the third LED 140.

Next, the conductive material layer is applied on the third passivation layer 115. The conductive material layer is etched in an area excluding an area overlapping the contact hole of the third passivation layer 115 to form a second n-type electrode 131P and a second p-type electrode 133P of the second LED 130 and a third n-type electrode 141P and the third p-type electrode 143P of the third LED 140.

Therefore, the formation of the second LED 130 which is formed of the second n-type semiconductor layer 131, the second light emitting layer 132, the second p-type semiconductor layer 133, the second n-type electrode 131P, and the second p-type electrode 133P may be completed. Therefore, the formation of the third LED 140 which is formed of the third n-type semiconductor layer 141, the third light emitting layer 142, the third p-type semiconductor layer 143, the third n-type electrode 141P, and the third p-type electrode 143P may be completed.

Next, the second protective layer 116 may be formed so as to cover the second LED 130 and the third LED 140.

Referring to FIG. 7M, the second connecting unit 182 is formed on the second protective layer 116.

Specifically, the second protective layer 116 is etched to form a contact hole which exposes the second n-type electrode 131P and the second p-type electrode 133P of the second LED 130. The second protective layer 116 is etched to form a contact hole which exposes the third n-type electrode 141P and the third p-type electrode 143P of the third LED 140.

Next, a conductive material layer may be formed on the second protective layer 116 to fill the contact hole of the second protective layer 116. The conductive material layer is etched to form the second connecting unit 182 which is connected to the second n-type electrode 131P, the second p-type electrode 133P, the third n-type electrode 141P, and the third p-type electrode 143P.

Hereinafter, a bonding process of a first substrate 110a and a second substrate 110b will be described with reference to FIGS. 7N and 7O.

The first substrate 110a and the second substrate 110b are bonded such that one surface of the first substrate 110a on which the formation of the first LED 120, the plurality of driving units DP, and the plurality of wiring lines is completed and one surface of the second substrate 110b on which the formation of the second LED 130 and the third LED 140 is completed are opposite to each other. Further, the filling member is filled in the space between the first substrate 110a and the second substrate 110b.

First, referring to FIG. 7N, FIG. 7N is a cross-sectional view of the first sub pixel SPX1 after bonding the first substrate 110a and the second substrate 110b.

Referring to FIG. 7N, after bonding the first substrate 110a and the second substrate 110b, the filling member 117 is charged between the first substrate 110a and the second substrate 110b.

The filling member 117 may be charged to fill the space between the first substrate 110a and the second substrate 110b. The filling member 117 may be formed of a transparent material so that the light emitted from the first LED 120 of one surface of the first substrate 110a is discharged to the second substrate 110b.

In this case, since only the third passivation layer 115 and the second protective layer 116 are disposed on one surface of the second substrate 110b in the first sub pixel SPX1, the light emitted from the first LED 120 of one surface of the first substrate 110a may be discharged through the second substrate 110b.

Referring to FIG. 7O, FIG. 7O is a cross-sectional view of the second sub pixel SPX2 after bonding the first substrate 110a and the second substrate 110b.

Referring to FIG. 7O, in the second sub pixel SPX2, in order to electrically connect the driving unit DP and the plurality of wiring lines of one surface of the first substrate 110a and the second LED 130 of one surface of the second substrate 110b, the first connecting unit 181 and the second connecting unit 182 are bonded at the time of bonding the first substrate 110a and the second substrate 110b.

Specifically, the conductive ball may be formed so as to be in contact with the first connecting unit 181 of the first substrate 110a or the second connecting unit 182 of the second substrate 110b.

Next, the first substrate 110a and the second substrate 110b may be aligned so that the first connecting unit 181 of the first substrate 110a and the second connecting unit 182 of the second substrate 110b may overlap each other.

As the first connecting unit 181 of the first substrate 110a and the second connecting unit 182 of the second substrate 110b are electrically connected to each other using a conductive ball, the first substrate 110a and the second substrate 110b may be bonded. In this case, as described above, the first connecting unit 181 of the first substrate 110a and the second connecting unit 182 of the second substrate 110b may be bonded to each other by the Eutectic bonding method.

Finally, the filling member 117 may be charged between the first substrate 110a and the second substrate 110b. The filling member 117 may be formed to fill the space between the first substrate 110a and the second substrate 110b.

In the related art, since the growth efficiency of the plurality of LEDs which emits different colored light varies depending on the type of the substrate, it is difficult to grow the plurality of LEDs which emits different colored light on one substrate. For example, the red LED has high growth efficiency in the gallium arsenic substrate or the gallium phosphide substrate and the green LED and the blue LED have high growth efficiency in the sapphire substrate or gallium nitride substrate. Therefore, the green LED and the blue LED may be grown on the same substrate, but the red LED should be grown on a separate substrate. Therefore, in order to implement the display device using the substrate on which the plurality of LEDs is grown, the green LED and the blue LED are transferred onto the substrate on which the red LED is grown or the red LED is transferred onto the substrate on which the green LED and the blue LED are grown. Alternatively, the red LED, the green LED, and the blue LED should be individually transferred onto a backplane substrate on which the driving unit is formed. However, in order to transfer the plurality of LEDs, a process time is increased and an alignment problem of the plurality of LEDs and the semiconductor elements is caused.

Therefore, in the display device 100 according to an exemplary embodiment of the present disclosure and the method of manufacturing the display device 100, after growing the plurality of LEDs 120, 130, and 140 on the first substrate 110a and the second substrate 110b, individually, the first substrate 110a and the second substrate 110b are bonded to manufacture the display device 100. Therefore, the plurality of LEDs 120, 130, and 140 may be formed in the display device 100 in a non-transfer manner. First, the first epitaxial layer 120m is grown on the first substrate 110a having high growth efficiency to form the first LED 120. The second epitaxial layer 130m and the third epitaxial layer 140m are grown on the second substrate 110b having high growth efficiency to form the second LED 130 and the third LED 140. In this case, the plurality of driving units DP and the plurality of wiring lines which drive the first LED 120, the second LED 130, and the third LED 140 are formed together on the first substrate 110a. Next, the first connecting unit 181 of the first substrate 110a and the second connecting unit 182 of the second substrate 110b are aligned and bonded to electrically connect the plurality of driving units DP and the plurality of wiring lines of the first substrate 110a to the second LED 130 and the third LED 140 of the second substrate 110b. Therefore, the first LED 120 of the first substrate 110a and the second LED 130 and the third LED 140 of the second substrate 110b may be driven by the plurality of driving units DP and the plurality of wiring lines of the first substrate 110a and may be implemented as one display device 100. Therefore, in consideration of the growth efficiency, even though the first LED 120, the second LED 130, and the third LED 140 are grown on different substrates 110a and 110b, the first substrate 110a and the second substrate 110b are bonded to implement one display device 100. Therefore, the plurality of LEDs 120, 130, and 140 may be disposed in the display device 100 by adopting the non-transfer manner. Therefore, in the display device 100 according to an exemplary embodiment of the present disclosure and the method of manufacturing the display device 100, the plurality of LEDs 120, 130, and 140 may be formed in the display device 100 in a non-transfer manner. Therefore, the transferring process is simplified, and the process time may be shortened.

Figure 8:
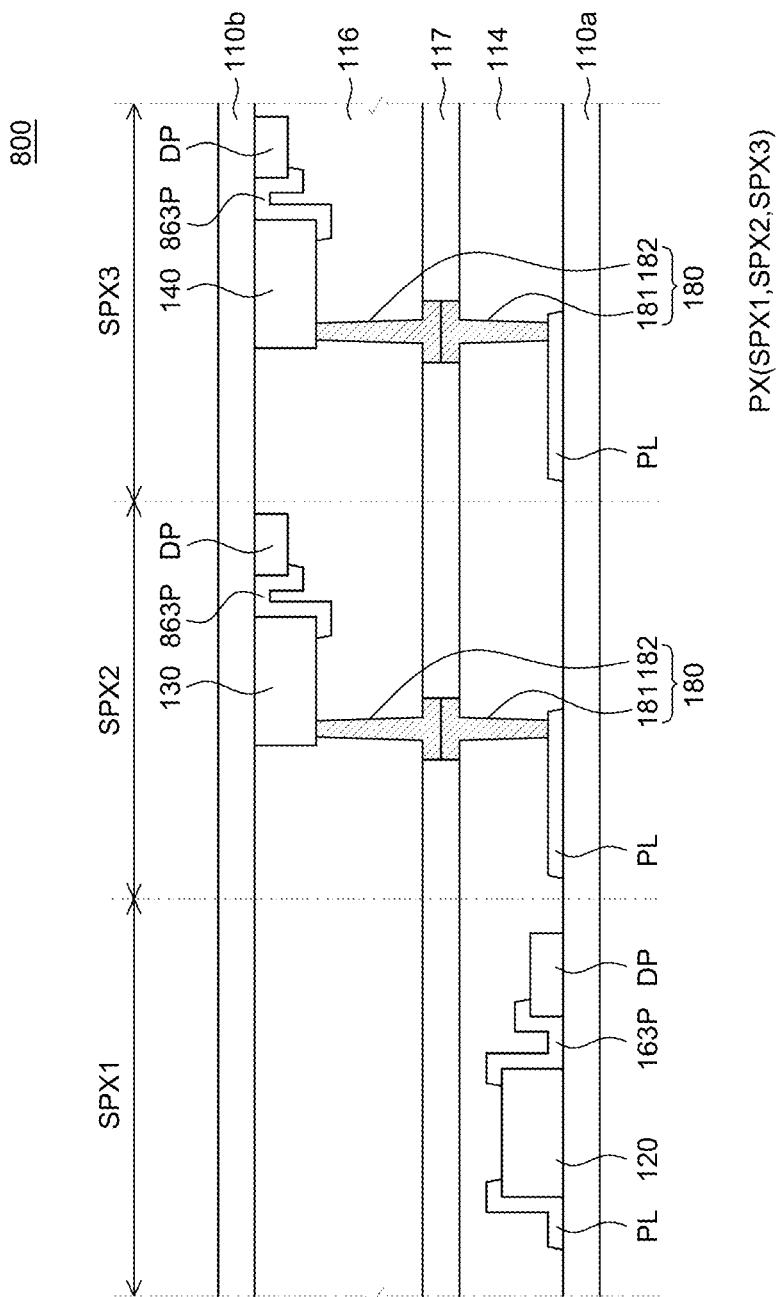
FIG. 8 is a schematic cross-sectional view of one pixel of a display device according to another exemplary embodiment of the present disclosure.
Figure 9:
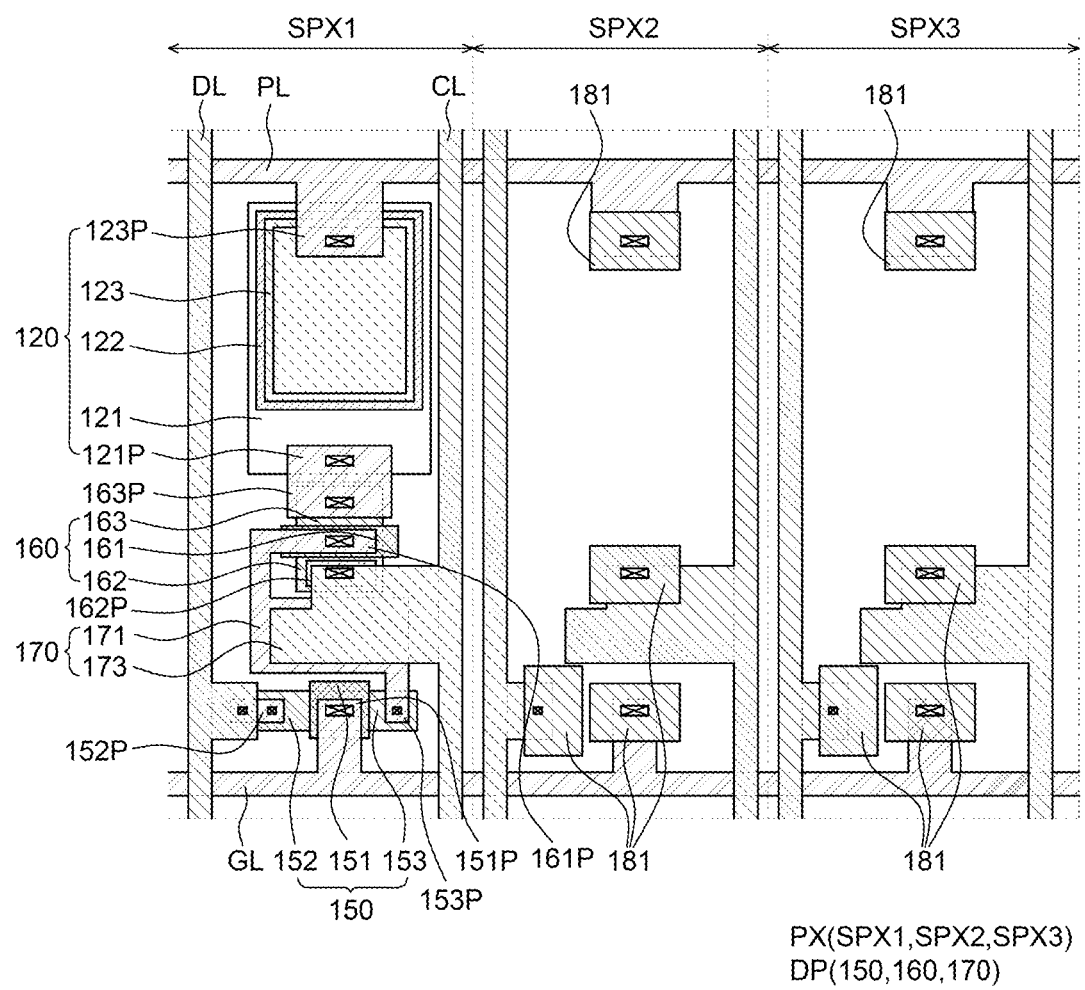
FIG. 9 is a plan view of one pixel on one surface of a first substrate of a display device according to another exemplary embodiment of the present disclosure.
Figure 10:
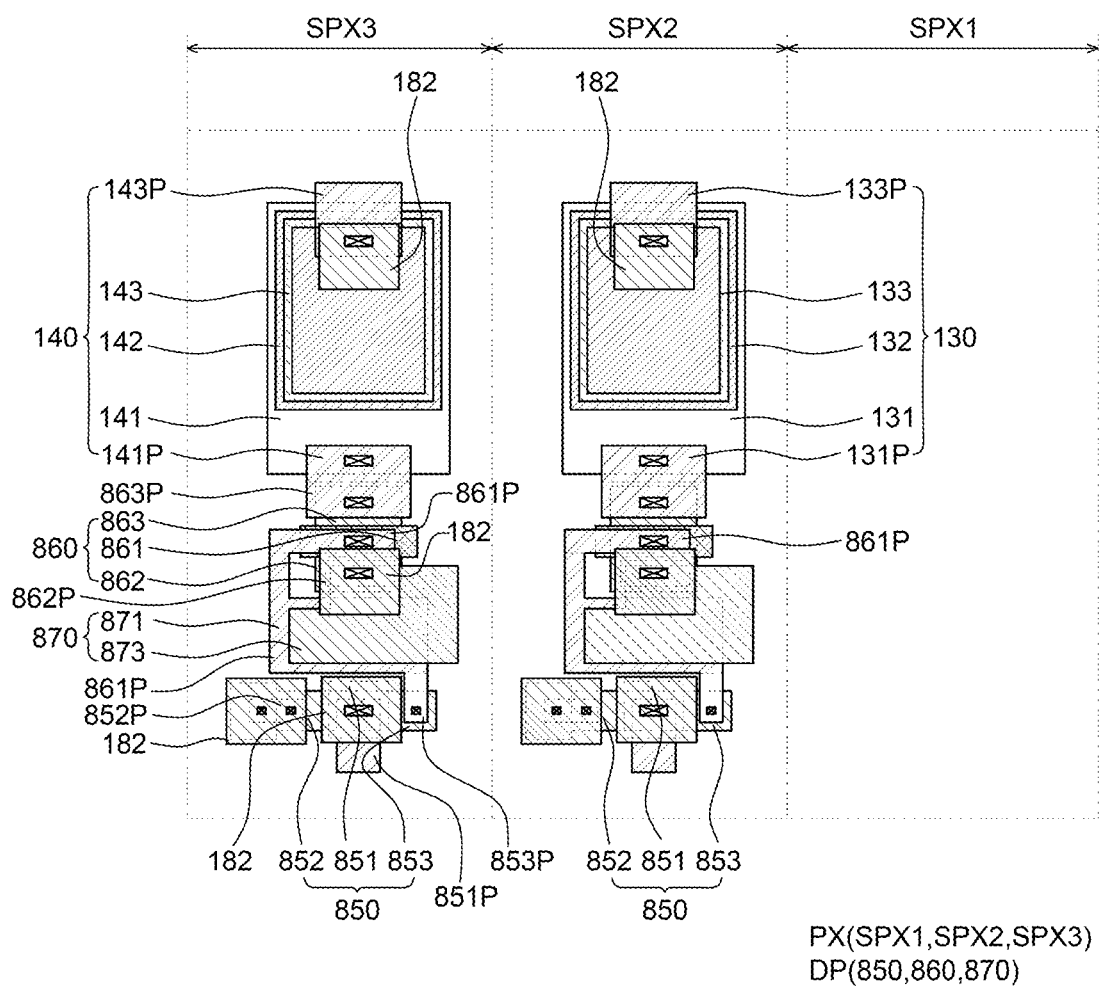
FIG. 10 is a plan view of one pixel on one surface of a second substrate of a display device according to another exemplary embodiment of the present disclosure.
Figure 11:
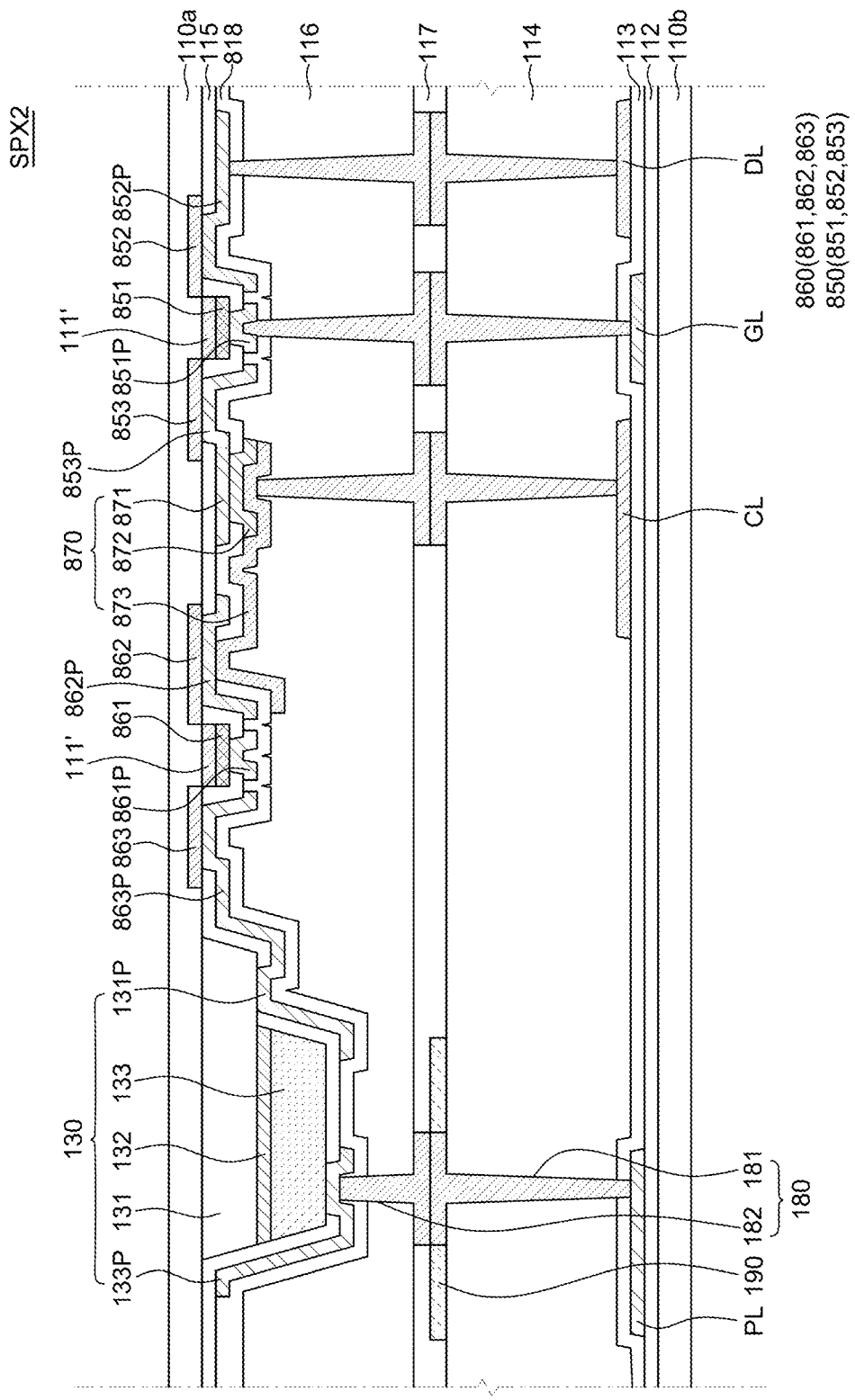
FIG. 11 is a cross-sectional view of a display device taken along the line XI-XI' of FIG. 10.

FIG. 8 is a schematic cross-sectional view of one pixel of a display device according to another exemplary embodiment of the present disclosure. FIG. 9 is a plan view of one pixel on one surface of a first substrate of a display device according to another exemplary embodiment of the present disclosure. FIG. 10 is a plan view of one pixel on one surface of a second substrate of a display device according to another exemplary embodiment of the present disclosure. FIG. 11 is a cross-sectional view of a display device taken along the line XI-XI' of FIG. 10. Configurations of a display device 800 of FIGS. 8 to 11 are substantially the same as the display device 100 of FIGS. 1 to 7O except for some driving unit DP of the plurality of driving units DP, so that a redundant description will be omitted.

Referring to FIG. 8, in a display device 800 according to another exemplary embodiment of the present disclosure, a first LED 120 and a driving unit DP and a plurality of wiring lines for driving the first LED 120 are disposed on one surface of the first substrate 110a. Further, a second LED 130, a third LED 140, and a driving unit DP which drives the second LED 130 and the third LED 140 are disposed on one surface of the second substrate 110b.

In this case, the second LED 130 and the driving unit DP of the second sub pixel SPX2 on one surface of the second substrate 110b may be electrically connected to the plurality of wiring lines of one surface of the first substrate 110a through the plurality of connecting units 180. Therefore, the second LED 130 and the driving unit DP of the second sub pixel SPX2 of one surface of the second substrate 110b are supplied with the voltage from the plurality of wiring lines to be driven.

The third LED 140 and the driving unit DP of the third sub pixel SPX3 on one surface of the second substrate 110b may be electrically connected to the plurality of wiring lines of one surface of the first substrate 110a through the plurality of connecting units 180. Therefore, the third LED 140 and the driving unit DP of the third sub pixel SPX3 of one surface of the second substrate 110b are supplied with the voltage from the plurality of wiring lines to be driven.

In the meantime, in FIG. 8, it is illustrated that the driving unit DP for driving the first LED 120 is disposed on one surface of the first substrate 110a and two driving units DP for driving the second LED 130 and the third LED 140 are disposed on one surface of the second substrate 110b. However, all the plurality of driving units DP may be disposed on one surface of the second substrate 110b or only some of the plurality of driving units DP may be disposed on the first substrate 110a and the second substrate 110b, respectively, and the arrangement of the plurality of driving units DP is not limited.

Hereinafter, the plurality of sub pixels SPX1, SPX2, and SPX3 of the first substrate 110a and the second substrate 110b will be described in more detail with reference to FIGS. 9 to 11.

Referring to FIG. 9, the first LED 120, the driving unit DP for driving the first LED 120, the plurality of wiring lines, and the first connecting unit 181 are disposed on one surface of the first substrate 110a.

In the first sub pixel SPX1, the first LED 120 and the driving unit DP are disposed on one surface of the first substrate 110a. In the second sub pixel SPX2 and the third sub pixel SPX3, only the first connecting unit 181 which is connected to the plurality of wiring lines is disposed on one surface of the first substrate 110a.

Specifically, the first LED 120, a first semiconductor element 150, a second semiconductor element 160, and a capacitor 170 of the driving unit DP may be disposed in the first sub pixel SPX1.

A first connecting unit 181 which is connected to the gate line GL, the data line DL, the power line PL, and the common line CL disposed along the boundary between the plurality of sub pixels SPX1, SPX2, and SPX3 is disposed in the second sub pixel SPX2.

A first connecting unit 181 which is connected to the gate line GL, the data line DL, the power line PL, and the common line CL disposed along the boundary between the plurality of sub pixels SPX1, SPX2, and SPX3 is disposed in the third sub pixel SPX3.

Referring to FIG. 10, a second LED 130, a third LED 140, and a driving unit DP which is connected to the second LED 130 and the fourth LED 140, respectively, and a second connecting unit 182 are disposed on one surface of the second substrate 110b.

In the first sub pixel SPX1 of one surface of the second substrate 110b, in order to discharge the light emitted from the first LED 120 of one surface of the first substrate 110a through the second substrate 110b, only the third passivation layer 115, a fourth passivation layer 818, and the second protective layer 116 are disposed, but a separate configuration may not be disposed.

In the second sub pixel SPX2, the second LED 130, the first semiconductor element 850, the second semiconductor element 860, and the capacitor 870 of the driving unit DP, and the second connecting unit 182 connected to the second LED 130 and the driving unit DP are disposed. Specifically, the second connecting unit 182 is disposed so as to be in contact with the second p-type electrode 133P of the second LED 130, a first source pad electrode 852P electrically connected to a first source region 852 of the first semiconductor element 850, a first gate pad electrode 851P electrically connected to the first gate electrode 851 of the first semiconductor element 850, a second source pad electrode 862P electrically connected to a second source region 862 of the second semiconductor element 860, and a second capacitor electrode 873, respectively.

In the third sub pixel SPX3, the third LED 140, the first semiconductor element 850, the second semiconductor element 860, and the capacitor 870 of the driving unit DP and the second connecting unit 182 connected to the third LED 140 and the driving unit DP are disposed. Specifically, the second connecting unit 182 is disposed so as to be in contact with the third p-type electrode 143P of the third LED 140, a first source pad electrode 852P electrically connected to a first source region 852 of the first semiconductor element 850, a first gate pad electrode 851P electrically connected to the first gate electrode 851 of the first semiconductor element 850, a second source pad electrode 862P electrically connected to a second source region 862 of the second semiconductor element 860, and a second capacitor electrode 873.

Referring to FIG. 11, the power line PL, the gate line GL, the common line CL, the data line DL, the first passivation layer 112, the second passivation layer 113, and the first protective layer 114 are disposed on one surface of the first substrate 110a.

The first passivation layer 112 is disposed on one surface of the first substrate 110a and the power line PL and the gate line GL are disposed on the first passivation layer 112.

The power line PL supplies the power voltage to the second p-type electrode 133P and the second p-type semiconductor layer 133 of the second LED 130 to drive the second LED 130. Therefore, the first connecting unit 181 is connected to the power line PL to electrically connect the power line PL of one surface of the first substrate 110a to the second LED 130 of one surface of the second substrate 110b. The first connecting unit 181 may be in contact with an upper surface of the power line PL through a contact hole formed in the second passivation layer 113 and the first protective layer 114 on the power line PL.

The gate line GL supplies the gate voltage to first gate electrodes 151 and 851 of the first semiconductor elements 150 and 850 of the plurality of driving units DP to turn on or off the first semiconductor elements 150 or 850. Therefore, the first connecting unit 181 is connected to the gate line GL to electrically connect the gate line GL of one surface of the first substrate 110a to the first gate electrode 851 of one surface of the second substrate 110b. The first connecting unit 181 may be in contact with an upper surface of the gate line GL through a contact hole formed in the second passivation layer 113 and the first protective layer 114 on the gate line GL.

The second passivation layer 113 is disposed on the power line PL and the gate line GL and the common line CL and the data line DL are disposed on the second passivation layer 113.

The common line CL may supply the common voltage to the second capacitor electrodes 173 and 873 of the plurality of driving units DP and the second source regions 162 and 862 of the second semiconductor elements 160 and 860. Therefore, the first connecting unit 181 is connected to the common line CL to electrically connect the common line CL of one surface of the first substrate 110a to the plurality of driving units DP of one surface of the second substrate 110b. The first connecting unit 181 may be in contact with the upper surface of the common line CL through the contact hole formed on the first protective layer 114 on the common line CL.

The data line DL transmits a data voltage to the first source regions 152 and 852 of the first semiconductor elements 150 and 850 of the plurality of driving units DP. Therefore, the first connecting unit 181 is connected to the data line DL to electrically connect the data line DL of one surface of the first substrate 110a to the plurality of driving units DP of one surface of the second substrate 110b. The first connecting unit 181 may be in contact with the upper surface of the data line DL through the contact hole formed on the first protective layer 114 on the data line DL.

The first protective layer 114 is disposed on one surface of the first substrate 110a so as to cover the common line CL and the data line DL. A plurality of contact holes is formed in the first protective layer 114 and the first connecting unit 181 may be connected to the power line PL, the gate line GL, the common line CL, and the data line DL below the first protective layer 114 through the plurality of contact holes of the first protective layer 114.

Referring to FIGS. 10 and 11, the second LED 130, the driving unit DP, an additional gate insulating layer 111', a third passivation layer 115, a fourth passivation layer 818, a second protective layer 116, and the second connecting unit 182 are disposed in the second sub pixel SPX2 of one surface of the second substrate 110b.

The second LED 130 and the first semiconductor element 850 and the second semiconductor element 860 of the driving unit DP are disposed on one surface of the second substrate 110b.

The second LED 130 includes a second n-type semiconductor layer 131 which is in contact with one surface of the second substrate 110b, a second light emitting layer 132 on the second n-type semiconductor layer 131, a second p-type semiconductor layer 133 on the second light emitting layer 132, and a second n-type electrode 131P and a second p-type electrode 133P. In this case, the second n-type semiconductor layer 131 of the second LED 130 may be supplied with the voltage from the second drain region 863 of the second semiconductor element 860 of the driving unit DP. The second p-type semiconductor layer 133 may be supplied with the voltage from the power line PL of one surface of the first substrate 110a. Therefore, in order to electrically connect the second p-type electrode 133P of the second LED 130 of one surface of the second substrate 110b and the power line PL of one surface of the first substrate 110a, the second connecting unit 182 is connected to the second p-type electrode 133P. The second connecting unit 182 may be in contact with the upper surface of the second p-type electrode 133P through the contact hole formed in the fourth passivation layer 818 and the second protective layer 116 on the second p-type electrode 133P. Therefore, the second connecting unit 182 may be in contact with the second p-type electrode 133P to be electrically connected to the second LED 130.

In this case, the second connecting unit 182 which is connected to the second p-type electrode 133P may be in contact with the first connecting unit 181 connected to the power line PL of one surface of the first substrate 110a. Therefore, the second LED 130 of one surface of the second substrate 110b may be electrically connected to the power line PL of one surface of the first substrate 110a through the second connecting unit 182 which is in contact with the second p-type electrode 133P and the first connecting unit 181 which is in contact with the second connecting unit 182.

The first semiconductor element 850 of the driving unit DP is disposed on one surface of the second substrate 110b. The first semiconductor element 850 is supplied with the gate voltage from the gate electrode 851 through the gate line GL to be turned on or off. Therefore, in order to electrically connect the first gate electrode 851 of the first semiconductor element 850 of one surface of the second substrate 110b and the gate line GL of one surface of the first substrate 110a, the second connecting unit 182 is connected to the first gate electrode 851. The second connecting unit 182 may be in contact with the upper surface of the first gate pad electrode 851P which is electrically connected to the first gate electrode 851 through the contact hole formed in the fourth passivation layer 818 and the second protective layer 116 on the first gate electrode 851. Therefore, the second connecting unit 182 is in contact with the first gate pad electrode 851P to be electrically connected to the first gate electrode 851 of the first semiconductor element 850.

In this case, the second connecting unit 182 which is connected to the first gate pad electrode 851P may be in contact with the first connecting unit 181 connected to the gate line GL of one surface of the first substrate 110a. Therefore, the first gate electrode 851 of one surface of the second substrate 110b may be electrically connected to the gate line GL of one surface of the first substrate 110a through the first gate pad electrode 851P, the second connecting unit 182, and the first connecting unit 181.

In the meantime, even though in FIGS. 10 and 11, it is illustrated that the first gate electrode 851 of the first semiconductor element 850 and the second connecting unit 182 are connected through the first gate pad electrode 851P, the first gate pad electrode 851P may be omitted and the second connecting unit 182 may be directly connected to the first gate electrode 851. The present disclosure is not limited thereto.

In the meantime, when the first semiconductor element 850 is turned on, the first source region 852 of the first semiconductor element 850 is supplied with the data voltage from the data line DL to transmit the data voltage to the second semiconductor element 860 and the capacitor 870. Therefore, in order to electrically connect the first source region 852 of the first semiconductor element 850 of one surface of the second substrate 110b and the data line DL of one surface of the first substrate 110a, the second connecting unit 182 is connected to the first source region 852. The second connecting unit 182 may be in contact with the upper surface of the first source pad electrode 852P which is electrically connected to the first source electrode 852 through the contact hole formed in the fourth passivation layer 818 and the second protective layer 116 on the first source region 852. Therefore, the second connecting unit 182 is in contact with the first source pad electrode 852P to be electrically connected to the first source region 852 of the first semiconductor element 850.

In this case, the second connecting unit 182 which is connected to the first source pad electrode 852P may be in contact with the first connecting unit 181 connected to the data line DL of one surface of the first substrate 110a. Therefore, the first source region 852 of one surface of the second substrate 110b may be electrically connected to the data line DL of one surface of the first substrate 110a through the first source pad electrode 852P, the second connecting unit 182, and the first connecting unit 181.

The second semiconductor element 860 of the second sub pixel SPX2 is disposed on one surface of the second substrate 110b. The second semiconductor element 860 is supplied with the voltage from the first drain region 853 of the first semiconductor element 850 from the second gate electrode 861 to be turned on or off. When the second semiconductor element 860 is turned on, the second source region 862 of the second semiconductor element 860 is supplied with the common voltage from the common line CL to transmit the common voltage to the second LED 130. In this case, the common voltage from the common line CL may be supplied to the second source pad electrode 862P which is electrically connected to the second source region 862 and the second capacitor electrode 873 which is integrally formed with the second source pad electrode 862P. Therefore, in order to electrically connect the second source region 862, the second source pad electrode 862P, and the second capacitor electrode 873 of the second semiconductor element 860 of one surface of the second substrate 110b to the common line CL of one surface of the first substrate 110a, the second connecting unit 182 is connected to the second source pad electrode 862P and the second capacitor electrode 873 which are integrally formed with each other. The second connecting unit 182 may be electrically connected to the second source pad electrode 862P which is electrically connected to the second source region 862 and the second capacitor electrode 873 through the contact hole formed in the second protective layer 116 on the second source pad electrode 862P and the second capacitor electrode 873.

In this case, the second connecting unit 182 which is connected to the second source pad electrode 862P and the second capacitor electrode 873 may be in contact with the first connecting unit 181 connected to the common line CL of one surface of the first substrate 110a. Therefore, the second source region 862 of one surface of the second substrate 110b may be electrically connected to the common line CL of one surface of the first substrate 110a through the second source pad electrode 862P, the second capacitor electrode 873, the second connecting unit 182, and the first connecting unit 181.

In the meantime, as some driving units DP among the plurality of driving units DP are disposed on one surface of the second substrate 110b, the additional gate insulating layer 111' is disposed on one surface of the second substrate 110b. The additional gate insulating layer 111' insulates the first gate electrode 851 of the first semiconductor element 850 of one surface of the second substrate 110b from the first source region 852 and the first drain region 853 and insulates the second gate electrode 861 of the second semiconductor element 860 from the second source region 862 and the second drain region 863.

In the display device 800 according to another exemplary embodiment of the present disclosure, the plurality of LEDs 120, 130, and 140 and the driving units DP for driving the plurality of LEDs 120, 130, and 140 are disposed on the same substrate, thereby minimizing an alignment error between the plurality of LEDs 120, 130, and 140 and the plurality of driving units DP. Specifically, the first LED 120 and the driving unit DP for driving the first LED 120 are disposed on one surface of the first substrate 110*a*. The second LED 130 and the driving unit DP for driving the second LED 130 and the third LED 140 and the driving unit DP for driving the third LED 140 are disposed on one surface of the second substrate 110*b*. That is, in the display device 800 according to another exemplary embodiment of the present disclosure, in accordance with the arrangement of the plurality of LEDs 120, 130, and 140, the plurality of driving units DP may be disposed on both the first substrate 110*a* and the second substrate 110*b*. Further, even though the plurality of wiring lines is disposed on the first substrate 110*a* and some driving units DP of the plurality of driving units DP are disposed on the second substrate 110*b*, the plurality of wiring lines and the plurality of driving units DP are electrically connected through the plurality of connecting units 180. Therefore, in the display device 800 according to another exemplary embodiment of the present disclosure, in accordance with the arrangement of the plurality of LEDs 120, 130, and 140, the plurality of driving units DP may be disposed on the same substrate as the plurality of LEDs 120, 130, and 140 and an alignment error between the plurality of LEDs 120, 130, and 140 and the plurality of driving units DP may be minimized.

The exemplary embodiments of the present disclosure can also be described as follows:

According to an embodiment of the present disclosure, there is provided a display device. The display device includes a first substrate and a second substrate which are formed of different materials, a first LED disposed on the first substrate, and a second LED and a third LED disposed on the second substrate. The first LED, the second LED, and the third LED are disposed between the first substrate and the second substrate.

The first LED may be a red LED and any one of the second LED and the third LED may be a blue LED and the other one is a green LED.

The display device may further include a plurality of driving units which drives the first LED, the second LED, and the third LED. At least one of the plurality of driving units may be disposed on the first substrate.

Each of the plurality of driving units may include a first semiconductor element including a first drain region, a second semiconductor element including a second gate electrode which is electrically connected to the first drain region, and a capacitor which includes a first capacitor electrode between the first drain region and the second gate electrode and a second capacitor electrode electrically connected to a second drain region of the second semiconductor element. The second drain region of the second semiconductor element of each of the plurality of driving units may be electrically connected to the first LED, the second LED, and the third LED.

The plurality of driving units may be disposed on the first substrate, and a driving unit which is electrically connected to the second LED or the third LED, among the plurality of driving units, may further include a connecting unit extending from the second drain region of the second semiconductor element to the second substrate.

Some of the plurality of driving units may be disposed on the first substrate, and the others of the plurality of driving units may be disposed on the second substrate.

The display device may further include a reflective layer which is disposed on the first substrate so as to overlap the second LED and the third LED.

The display device may further include a first protective layer which is disposed on the entire first substrate so as to cover the first LED, a second protective layer which is disposed on the entire second substrate so as to cover the second LED and the third LED, and a filling member disposed between the first protective layer and the second protective layer.

Light emitted from the first LED, the second LED, and the third LED may be discharged through the second substrate.

According to another embodiment of the present disclosure, there is provided a display device. The display device includes a first substrate in which a first LED is disposed on one surface, and a second substrate in which a second LED and a third LED are disposed on one surface. The first substrate is disposed on one surface of the second substrate so as to be opposite to the second LED and the third LED, the second substrate is disposed on one surface of the first substrate so as to be opposite to the first LED, and growth efficiency of the first LED on the first substrate is higher than that on the second substrate, and growth efficiency of the second LED and the third LED on the second substrate is higher than that on the first substrate.

The first substrate may be an opaque substrate and the second substrate is a transparent substrate.

The second LED and the third LED may emit blue light and green light, respectively, and the second substrate may be any one of a sapphire substrate and a gallium nitride substrate.

The first LED may emit red light, and the first substrate may be any one of a gallium arsenic substrate and a gallium phosphide substrate.

The display device may further include a filling member and a reflective layer between the first substrate and the second substrate. The reflective layer may overlap an area excluding an area in which the first LED is disposed.

The first LED may include a first n-type semiconductor layer which is in contact with one surface of the first substrate, a first light emitting layer on the first n-type semiconductor layer, and a first p-type semiconductor layer on the first light emitting layer. The second LED may include a second n-type semiconductor layer which is in contact with one surface of the second substrate, a second light emitting layer on the second n-type semiconductor layer, and a second p-type semiconductor layer on the second light emitting layer. The third LED may include a third n-type semiconductor layer which is in contact with one surface of the second substrate, a third light emitting layer on the third n-type semiconductor layer, and a third p-type semiconductor layer on the third light emitting layer.

Light emitted from the first light emitting layer may be incident onto the first p-type semiconductor layer, and light emitted from the second light emitting layer and the third light emitting layer may be incident onto the second n-type semiconductor layer and the third n-type semiconductor layer, respectively.

According to still another embodiment of the present disclosure, there is provided a method of manufacturing a display device. The method of manufacturing a display device includes forming a first LED on one surface of a first substrate, forming a second LED and a third LED on one surface of a second substrate and bonding the first substrate and the second substrate such that one surface of the first substrate and one surface of the second substrate are opposite to each other.

The method of manufacturing a display device may further include forming a first driving unit for driving the first LED, a second driving unit for driving the second LED, and a third driving unit for driving the third LED on one surface of the first substrate, forming a first protective layer on the entire first substrate so as to cover the first LED, the first driving unit, the second driving unit, and the third driving unit, and forming a connecting unit which extends from the second driving unit and the third driving unit to an upper surface of the first protective layer.

The method of manufacturing a display device may further include forming a first driving unit for driving the first LED on the first substrate, and forming a second driving unit for driving the second LED and a third driving unit for driving the third LED on the second substrate. The first LED may overlap an area excluding an area where the second LED, the third LED, the second driving unit, and the third driving unit are disposed in the second substrate.

The forming of a first LED on one surface of a first substrate may include growing a first epitaxial layer which is formed of a first n-type semiconductor material layer, a first light emitting material layer, and a first p-type semiconductor material layer on one surface of the first substrate, etching the first epitaxial layer to form a first n-type semiconductor layer, a first light emitting layer, and a first p-type semiconductor layer, and forming a first n-type electrode and a first p-type electrode which are in contact with the first n-type semiconductor layer and the first p-type semiconductor layer, respectively, and one surface of the first n-type semiconductor layer may outwardly protrude from the first p-type semiconductor layer and the first light emitting layer.

The forming of the second LED and the third LED on one surface of the second substrate may include growing a second epitaxial layer which is formed of a second n-type semiconductor material layer, a second light emitting material layer, and a second p-type semiconductor material layer on one surface of the second substrate, etching the second epitaxial layer to form a second n-type semiconductor layer, a second light emitting layer, and a second p-type semiconductor layer, growing a third epitaxial layer which is formed of a third p-type semiconductor material layer, a third light emitting material layer, and a third n-type semiconductor material layer on one surface of the second substrate, etching the third epitaxial layer to form a third n-type semiconductor layer, a third light emitting layer, and a third p-type semiconductor layer, and forming a second n-type electrode, a second p-type electrode, a third n-type electrode, and a third p-type electrode which are in contact with the second n-type semiconductor layer, the second p-type semiconductor layer, the third n-type semiconductor layer, and the third p-type semiconductor layer, respectively.

During the etching of the second epitaxial layer to form the second n-type semiconductor layer, the second light emitting layer, and the second p-type semiconductor layer, a lower portion of the second p-type semiconductor material layer may be left in an area overlapping an area where the third LED is formed and only an upper portion of the second semiconductor material layer may be etched. During the growing of the third epitaxial layer, the third p-type semiconductor material layer, the third light emitting material layer, and the third n-type semiconductor material layer may be grown on a lower portion of the second p-type semiconductor material layer of one surface of the second substrate.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a first substrate;
   a second substrate that is formed of a different material than the first substrate;
   a first light emitting diode (LED) on the first substrate;
   a second LED and a third LED on the second substrate; and
   a plurality of driving circuits configured to drive the first LED, the second LED, and the third LED,
   wherein the first LED, the second LED, and the third LED are positioned between the first substrate and the second substrate,
   wherein the first LED is a red LED,
   wherein any one of the second LED or the third LED is a blue LED, and the other one of the second LED or the third LED is a green LED,
   wherein at least one of the plurality of driving circuits is on the first substrate,
   wherein a first set of driving circuits of the plurality of driving circuits are on the first substrate, and
   wherein a second set of driving circuits of the plurality of driving circuits are on the second substrate.

2. The display device according to claim 1, wherein each of the plurality of driving circuits includes:
   a first semiconductor element including a first drain region;
   a second semiconductor element including a first gate electrode that is electrically connected to the first drain region; and
   a capacitor including a first capacitor electrode between the first drain region and the first gate electrode, and a second capacitor electrode electrically connected to a second drain region of the second semiconductor element, and
   wherein the second drain region of the second semiconductor element of each of the plurality of driving circuits is electrically connected to the first LED, the second LED, and the third LED.

3. The display device according to claim 2, wherein the plurality of driving circuits is on the first substrate, and
   a driving unit, which is electrically connected to the second LED or the third LED, among the plurality of driving circuits, includes a connecting unit extending from the second drain region of the second semiconductor element to the second substrate.

4. The display device according to claim 1, further comprising:
a reflective layer on the first substrate, and overlapping the second LED and the third LED.

5. A display device comprising:
a first substrate;
a second substrate that is formed of a different material than the first substrate;
a first light emitting diode (LED) on the first substrate;
a second LED and a third LED on the second substrate;
a first protective layer on the first substrate, and covering the first LED;
a second protective layer on the second substrate, and covering the second LED and the third LED; and
a filling member between the first protective layer and the second protective layer,
wherein the first LED, the second LED, and the third LED are positioned between the first substrate and the second substrate.

6. A display device, comprising:
a first substrate;
a first light emitting diode (LED) on a surface of the first substrate;
a second substrate;
a second LED and a third LED on a surface of the second substrate; and
a filling member and a reflective layer between the first substrate and the second substrate, wherein the reflective layer overlaps an area excluding an area in which the first LED is positioned,
wherein the surface of the first substrate faces the surface of the second substrate, and
wherein growth efficiency of the first LED on the surface of the first substrate is higher than that on the second substrate, and growth efficiency of the second LED and the third LED on the surface of the second substrate is higher than that on the first substrate.

7. The display device according to claim 6, wherein the first substrate is an opaque substrate and the second substrate is a transparent substrate.

8. The display device according to claim 7, wherein the second LED and the third LED emit blue light and green light, respectively, and
wherein the second substrate is any one of a sapphire substrate or a gallium nitride substrate.

9. The display device according to claim 7, wherein the first LED emits red light, and
wherein the first substrate is any one of a gallium arsenic substrate or a gallium phosphide substrate.

10. The display device according to claim 6, wherein the first LED includes a first n-type semiconductor layer that is in contact with the surface of the first substrate, a first light emitting layer on the first n-type semiconductor layer, and a first p-type semiconductor layer on the first light emitting layer,
wherein the second LED includes a second n-type semiconductor layer that is in contact with the surface of the second substrate, a second light emitting layer on the second n-type semiconductor layer, and a second p-type semiconductor layer on the second light emitting layer, and
wherein the third LED includes a third n-type semiconductor layer which is in contact with the surface of the second substrate, a third light emitting layer on the third n-type semiconductor layer, and a third p-type semiconductor layer on the third light emitting layer.

* * * * *